United States Patent
Gao

(10) Patent No.: US 12,156,346 B2
(45) Date of Patent: Nov. 26, 2024

(54) CIRCUIT BOARD, ELECTRONIC DEVICE, AND PRODUCTION METHOD FOR CIRCUIT BOARD

(71) Applicant: Honor Device Co., Ltd., Shenzhen (CN)

(72) Inventor: Leiwen Gao, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/908,759

(22) PCT Filed: Apr. 27, 2022

(86) PCT No.: PCT/CN2022/089474
§ 371 (c)(1),
(2) Date: Sep. 1, 2022

(87) PCT Pub. No.: WO2023/000750
PCT Pub. Date: Jan. 26, 2023

(65) Prior Publication Data
US 2024/0196543 A1    Jun. 13, 2024

(30) Foreign Application Priority Data
Jul. 20, 2021 (CN) .......................... 202110821567.5

(51) Int. Cl.
*H05K 1/18* (2006.01)
*H05K 3/28* (2006.01)
*H05K 3/34* (2006.01)

(52) U.S. Cl.
CPC ............. *H05K 3/282* (2013.01); *H05K 1/181* (2013.01); *H05K 3/341* (2013.01); *H05K 2201/10984* (2013.01)

(58) Field of Classification Search
CPC ........ H05K 1/181; H05K 3/282; H05K 3/341; H05K 2201/10984
See application file for complete search history.

(56) References Cited

U.S. PATENT DOCUMENTS

| 4,260,451 | A |   | 4/1981 | Schmeckenbecher |
| 5,274,913 | A | * | 1/1994 | Grebe ................. H01L 23/3135 29/841 |

(Continued)

FOREIGN PATENT DOCUMENTS

| CN | 101302615 A | 11/2008 |
| CN | 103384448 A | 11/2013 |

(Continued)

OTHER PUBLICATIONS

Liao Bokai et al: "Recent advances in method of suppressing dendrite formation of tin-based solder alloys", Journal of Materials Science: Materials in Electronics, Chapman and Hall, London, GB, vol. 31, No. 16, Jul. 7, 2020 (Jul. 7, 2020), 10 pages.

*Primary Examiner* — Hoa C Nguyen
(74) *Attorney, Agent, or Firm* — Slater Matsil, LLP

(57) ABSTRACT

This application provides a circuit board, an electronic device, and a production method for a circuit board. The circuit board includes: a board body; an electronic component, welded to a surface of the board body by using soldering tin; and a reaction particle, disposed on the surface of the board body and adjacent to a weld leg for welding the electronic component. When the circuit board is energized and in an environment with water, the reaction particle reacts with the weld leg to form an insoluble protection layer on an outer surface of the weld leg, and the insoluble protection layer isolates the weld leg from water to prevent dendrite corrosion of the weld leg.

20 Claims, 9 Drawing Sheets

(56) References Cited

U.S. PATENT DOCUMENTS

| | | | | |
|---|---|---|---|---|
| 5,940,728 | A * | 8/1999 | Katayama | H01L 24/75 |
| | | | | 257/E21.511 |
| 5,976,302 | A * | 11/1999 | Oppermann | H01L 24/81 |
| | | | | 257/E21.511 |
| 6,050,481 | A * | 4/2000 | Chapman | H05K 3/3436 |
| | | | | 257/E21.508 |
| 6,337,445 | B1 * | 1/2002 | Abbott | H01L 24/12 |
| | | | | 174/257 |
| 6,712,260 | B1 * | 3/2004 | Kuo | B23K 1/0016 |
| | | | | 228/205 |
| 6,723,627 | B1 * | 4/2004 | Kariyazaki | H01L 21/563 |
| | | | | 257/E21.511 |
| 6,774,314 | B2 * | 8/2004 | Toyoshima | H01L 24/10 |
| | | | | 361/779 |
| 6,805,279 | B2 * | 10/2004 | Lee | H01L 21/4853 |
| | | | | 228/205 |
| 6,852,931 | B2 * | 2/2005 | Hedler | H01L 23/49894 |
| | | | | 257/E21.511 |
| 6,908,788 | B1 * | 6/2005 | Lin | H01L 21/4853 |
| | | | | 438/106 |
| 7,736,445 | B2 | 6/2010 | Yagi et al. | |
| 8,258,637 | B2 * | 9/2012 | Sakamoto | H01L 23/49816 |
| | | | | 257/737 |
| 8,973,258 | B2 | 3/2015 | Chen | |
| 9,793,237 | B2 * | 10/2017 | Railkar | H01L 24/81 |
| 10,403,591 | B2 | 9/2019 | Gandhi et al. | |
| 2007/0131141 | A1 | 6/2007 | Masatoki et al. | |
| 2008/0280029 | A1 | 11/2008 | Yagi et al. | |
| 2010/0184285 | A1 | 7/2010 | Hua et al. | |
| 2011/0253429 | A1 | 10/2011 | Humphries et al. | |

FOREIGN PATENT DOCUMENTS

| | | |
|---|---|---|
| CN | 103531485 A | 1/2014 |
| CN | 105047573 A | 11/2015 |
| CN | 106131250 A | 11/2016 |
| CN | 106255318 A | 12/2016 |
| CN | 111357087 A | 6/2020 |
| CN | 113573493 A | 10/2021 |
| JP | 2003243561 A | 8/2003 |

* cited by examiner

CIRCUIT BOARD, ELECTRONIC DEVICE, AND PRODUCTION METHOD FOR CIRCUIT BOARD

CROSS-REFERENCE TO RELATED APPLICATIONS

This application is a National Stage of International Application No. PCT/CN2022/089474, filed Apr. 27, 2022, which claims priority to Chinese Patent Application No. 202110821567.5, filed Jul. 20, 2021, both of which are hereby incorporated by reference in their entireties.

TECHNICAL FIELD

This application relates to the field of electronic product technologies, and in particular, to a circuit board, an electronic device, and a production method for a circuit board.

BACKGROUND

With the development of information technologies, various electronic products are increasingly appearing in people's daily life. A circuit board is a main component for an electronic product to implement each function. The circuit board generally includes a board body and an electronic component that is fastened to the board body by means of welding. A tin weld leg used to fasten the electronic component exists on an outer surface of the board body.

When there is water or moisture entering the electronic device, the tin weld leg on the outer surface of the board body is often subject to dendrite corrosion in a case of electrification. The following describes a dendrite corrosion process. As shown in FIG. 1, an anode tin weld leg is oxidized in water and dissolved to obtain a tin ion, and the tin ion moves to a cathode due to a potential difference between the anode and the cathode to obtain an electron, so as to form tin dendrite. As shown in FIG. 2, continuous generation of dendrites easily causes a connection among different weld legs, and causes a short circuit, which causes a part of functions of an electronic product to fail, thereby affecting reliability of the electronic product.

In a related technology, to suppress dendrite corrosion of a weld leg on a circuit board, an outer surface of the circuit board is usually covered with an insulation layer, so as to prevent the weld leg from contacting water, thereby avoiding dendrite corrosion of the weld leg.

However, because each electronic component is installed on the board body, a geometric appearance of the outer surface of the circuit board is often complex. In addition, there are a relatively large quantity and variety of electronic components on the board body, and a radio frequency antenna and a relatively large quantity of electrical connection points, which cannot be covered by the insulation layer, are disposed on the outer surface of the board body. Therefore, a disposing process of the insulation layer is relatively complex, and consequently, costs of the electronic product are relatively high.

In addition, because there is a relatively low probability of water or moisture entering the electronic device, insulation layers of most electronic products do not function when in use. If an isolation layer is disposed on a circuit board for each electronic product, costs are further increased.

SUMMARY

This application provides a circuit board, an electronic device, and a production method for a circuit board, so as to prevent dendrite corrosion of the circuit board, and production costs are relatively low.

According to a first aspect, this application provides a circuit board, including:
 a board body;
 an electronic component, welded to a surface of the board body by using soldering tin; and
 a reaction particle, disposed on the surface of the board body and adjacent to a weld leg for welding the electronic component, where when the circuit board is energized and in an environment with water, the reaction particle reacts with the weld leg to form an insoluble protection layer on an outer surface of the weld leg, and the insoluble protection layer isolates the weld leg from water.

The board body may include a substrate and a conducting layer, and the conducting layer is fastened to the substrate. A connector may be disposed on a surface of the substrate, one end of the connector is electrically connected to the conducting layer, the other end of the connector passes through the substrate and is located on an outer surface of the substrate, and the other end of the connector is configured to be electrically connected to a pin of the electronic component. Specifically, the connector may be a bonding pad. A material of the substrate is an insulation material, and the insulation material may be, for example, a resin, a glass fiber, or another insulation material. The conducting layer may be a copper foil, the conducting layer is configured to form wiring in the circuit board, or the conducting layer may be another conductive material.

According to wiring distribution, the board body may be a single-layer board, dual-layer board, or multi-layer board. When the board body is a multi-layer board, the board body includes a multi-layer conducting layer and a multi-layer substrate, and the multi-layer conducting layer and the multi-layer substrate are alternately stacked. According to a property of the substrate, the board body may be a rigid board, or may be a flexible board. The board body in this embodiment of this application may be a printed circuit board (printed circuit board, PCB).

The electronic component may include, but is not limited to, a power management unit, a radio frequency integrated circuit, a radio frequency power amplifier, a wireless fidelity chip, a resistor, a capacitor, an inductor, a transistor, a processor, a memory, a camera, a flash lamp, a microphone, a speaker, a battery, and the like.

The electronic component may be a sheet-like component, and may be electrically connected to a board body by using a surface mount technology SMT.

The reaction particle may be disposed on the outer surface of the weld leg, or may be disposed on an entire outer surface of the board body and the weld leg, or may be disposed at a location, on the surface of the board body, where no weld leg is disposed and adjacent to the weld leg.

The reaction particle of the circuit board provided in this embodiment of this application is adjacent to the weld leg for welding the electronic component. When the circuit board is energized and in an environment with water, the reaction particle reacts with the weld leg to form an insoluble protection layer on the outer surface of the weld leg. In this way, the insoluble protection layer can isolate the weld leg from water, to prevent the weld leg from contacting water. In this way, when there is water on the circuit board, dendrite corrosion of the weld leg can be prevented.

In addition, in this embodiment of this application, the reaction particle only needs to be attached to a location adjacent to the weld leg on the surface of the board body, and may react with the weld leg when the circuit board is energized and in an environment with water, so that an insoluble protection layer is formed on the outer surface of the weld leg. In this embodiment of this application, a form, a density, a location, and the like of the reaction particle are not strictly and specifically required. Therefore, disposing of the reaction particle is not easily limited by a geometric appearance of the circuit board, and is not easily affected by a component that needs to be exposed outside, such as an antenna and an electrical connection point. Therefore, a disposing process of the reaction particle on the board body is more flexible, simple, and easy to operate, so that a production process of the circuit board and the electronic device is also simple, and production costs of the circuit board and the electronic device are relatively low.

In addition, a form of the reaction particle is relatively flexible, the reaction particle does not need to have an isolation function, and there is no need to set a very large density. Therefore, disposing of the reaction particle is not easy to cause an obstacle to radiation of an antenna, and a radiation function of the antenna is not easy to be affected, so that reliability of a wireless communication function of the electronic device is better.

In an optional design, the reaction particle is a compound, and anionic reducibility of the compound is higher than that of tin.

When reducibility of a substance is relatively high, that is, an electron loss capacity of the substance is relatively high, and the substance is more easily oxidized. A reducibility order of nonmetallic anions can be determined according to electronegativity/activity: $S^{2-}>I^->Br^->B^->Cl^->OH^->$oxygenated acid ions$>Sn^{2-}$.

$Br^-$, $B^-$, $Cl^-$ and oxygenated acid ions, and products produced by reaction between such ions and tin are easily dissolved in water, or cannot react with tin after oxidation. These ions are not suitable as anions for reaction particles. Therefore, the foregoing compound may be a sulfide, a complex of sulfur, an iodide, a complex of iodine, or a hydroxide.

In this embodiment, because anionic reducibility of the reaction particle is higher than that of tin, when electrochemical corrosion occurs, an electron loss capability of anion of the reaction particle is stronger than that of tin. The anion of the reaction particle is oxidized before tin, so as to suppress oxidization and dissolving of the tin weld leg, thereby further reducing a probability that the tin weld leg is oxidized and dissolved to a tin particle, and reducing a probability of dendrite corrosion of the weld leg.

In an optional design, the compound is a sulfide or an iodide.

In this embodiment, because anions in the sulfide and the iodide are sulfur ions and iodine ions, in an environment with water, the sulfur ions or the iodine ions can react with dissolved tin ions to form a precipitate, so as to form a tin disulfide protection layer or a tin tetraiodide protection layer on an outer surface of the tin weld leg.

In addition, after the sulfur ions or the iodine ions are oxidized to a sulfur or iodine elementary substance, the sulfur or iodine elementary substance may further react with the tin weld leg quickly to form a tin disulfide protection layer or a tin tetraiodide protection layer, thereby increasing a speed and a probability of forming the insoluble protection layer, so that the generated insoluble protection layer can better cover the outer surface of the weld leg to make the weld leg better isolated from water, and a probability of the weld leg being oxidized and dissolved is further reduced, thereby reducing a probability of dendrite corrosion of the weld leg.

In an optional design, the insoluble protection layer is a tin sulfide protection layer or a tin iodide protection layer.

Because tin sulfide or tin iodide is not dissolvable in water, when the insoluble protection layer is a tin sulfide protection layer or a tin iodide protection layer, the insoluble protection layer may be more reliably attached to the surface of the weld leg, and the insoluble protection layer may more reliably isolate the weld leg from water, thereby better preventing dendrite corrosion of the weld leg.

In an optional design, the reaction particle is disposed on the outer surface of the weld leg.

In this embodiment, the reaction particle is directly disposed on the outer surface of the weld leg, and the reaction particle is in contact with the weld leg. In this way, in a case of the circuit board in contact with water and energized, the reaction particle can react quickly with the weld leg to form an insoluble protection layer, and a probability of the weld leg being oxidized and dissolved is reduced, thereby reducing a probability of dendrite corrosion of the weld leg. In addition, in this embodiment, there is no need to dispose the reaction particle on the surface of the board body except the weld leg, thereby reducing impact of the reaction particle on the board body and making the circuit board more reliable.

In an optional design, the reaction particle is dissolvable in water.

For example, the reaction particle may be any one of sodium sulfide, potassium sulfide, sodium iodide, potassium iodide, calcium iodide, or potassium hydroxide, but is not limited thereto.

In this embodiment, because the reaction particle is dissolvable in water, when the circuit board is in an environment with water, the reaction particle can be more evenly distributed in water after being dissolved in water, and can be more evenly distributed in water attached on the outer surface of the weld leg, so that the reaction particle in water can react with each part of the outer surface of the weld leg more evenly. Each part of the outer surface of the weld leg can quickly and evenly form an insoluble protection layer, so that each part of the outer surface of the weld leg cannot contact water, thereby reducing a probability of dendrite corrosion of the weld leg.

In an optional design, the reaction particle is attached to the surface of the board body in a form of powder or a particle.

In this embodiment, because a process of attaching the reaction particle in the form of powder or a particle to the surface of the board body is relatively simple, the reaction particle is attached to the surface of the board body in the form of powder or a particle, which may make a production process of the circuit board and an electronic device simpler, thereby reducing costs of the circuit board and the electronic device.

According to a second aspect, an embodiment of this application provides a circuit board, including a board body, an electronic component, and an insoluble protection layer. The electronic component is welded to a surface of the board body by using soldering tin, and the insoluble protection layer is attached to an outer surface of the weld leg for welding the electronic component, so as to isolate the weld leg from water. When the circuit board is energized and in an environment with water, the insoluble protection layer is a protection layer obtained from reaction between the weld leg and a reaction particle, which is disposed on the surface of the board body and adjacent to the weld leg.

The insoluble protection layer on the weld leg of the circuit board provided in this embodiment can isolate the weld leg from water, so that the weld leg does not contact water. In this way, when there is water on the circuit board, dendrite corrosion of the weld leg can be prevented.

In addition, the insoluble protection layer is obtained, when the circuit board is energized and in an environment with water, from reaction between the weld leg and the reaction particle on the surface of the board body. Therefore, the reaction particle only needs to be attached to a location adjacent to the weld leg on the surface of the board body, and the reaction particle may react with the weld leg when the circuit board is energized and in an environment with water, so that the insoluble protection layer is formed on the outer surface of the weld leg. In this embodiment of this application, a form, a density, a location, and the like of the reaction particle are not strictly and specifically required. Therefore, disposing of the reaction particle is not easily limited by a geometric appearance of the circuit board, and is not easily affected by a component that needs to be exposed outside, such as an antenna and an electrical connection point. Therefore, a disposing process of the reaction particle on the board body is more flexible, simple, and easy to operate, so that a production process of the circuit board and the electronic device is also simple, and production costs of the circuit board and the electronic device are relatively low.

Because a form of the reaction particle is relatively flexible, the reaction particle does not need to have an isolation function, and there is no need to set a very large density, in this case, disposing of the reaction particle is not easy to cause an obstacle to radiation of an antenna, and a radiation function of the antenna is not easy to be affected, so that reliability of a wireless communication function of the electronic device is better.

According to a third aspect, an embodiment of this application provides an electronic device, including a housing and the circuit board installed in the housing according to any one of the first aspect or the second aspect.

According to the electronic device provided in this embodiment, when the circuit board is energized and in an environment with water, a reaction particle reacts with a weld leg to form an insoluble protection layer on an outer surface of the weld leg. The insoluble protection layer can isolate the weld leg from water, to prevent the weld leg from contacting water. In this way, when there is water on the circuit board, dendrite corrosion of the weld leg can be prevented.

In addition, disposing of the reaction particle is not easily limited by a geometric appearance of the circuit board, and is not easily affected by a component that needs to be exposed outside, such as an antenna and an electrical connection point. Therefore, a disposing process of the reaction particle on a board body is more flexible, simple, and easy to operate, so that a production process of the circuit board and the electronic device is also simple, and production costs of the circuit board and the electronic device are relatively low.

Because a form of the reaction particle is relatively flexible, the reaction particle does not need to have an isolation function, and there is no need to set a very large density, in this case, disposing of the reaction particle is not easy to cause an obstacle to radiation of an antenna, and a radiation function of the antenna is not easy to be affected, so that reliability of a wireless communication function of the electronic device is better.

According to a fourth aspect, an embodiment of this application provides a production method for a circuit board, where the method includes:

welding an electronic component to a board body by using soldering tin; and disposing a reaction particle at a location, on a surface of the board body, which is adjacent to a weld leg for welding the electronic component, to obtain the circuit board, where when the circuit board is energized and in an environment with water, the reaction particle reacts with the weld leg to form an insoluble protection layer on an outer surface of the weld leg, and the insoluble protection layer isolates the weld leg from water.

In this embodiment, by using a welding process such as reflow soldering, wave soldering, and dip soldering, the electronic component may be welded to the board body by using soldering tin, or may be welded by using another welding process. This is not specifically limited in this application.

In this embodiment, the reaction particle may be disposed on the surface of the board body by using any one of a coating method, a printing method, a silk printing method, a soaking method, an atomization sedimentation method, a steam method, a vapor deposition method, a sputtering method, a spraying method, or 3D printing.

Optionally, a solution containing the reaction particle may be prepared, the solution containing the reaction particle is adsorbed on the surface of the board body, and the reaction particle is formed on the surface of the board body after drying. Alternatively, powder or a particle of the reaction particle may be directly attached to an outer surface of the board body by using a 3D printing method, a spraying method, a sputtering method, or the like.

According to the production method for a circuit board provided in this embodiment of this application, the reaction particle is disposed at a location, on the surface of the board body, which is adjacent to the weld leg for welding the electronic component. When the circuit board is energized and in an environment with water, the reaction particle reacts with the weld leg to form an insoluble protection layer on the outer surface of the weld leg. In this way, the insoluble protection layer can isolate the weld leg from water, to prevent the weld leg from contacting water. In this way, when there is water on the circuit board, dendrite corrosion of the weld leg can be prevented.

In addition, in this embodiment of this application, the reaction particle only needs to be disposed at a location, on the surface of the board body, which is adjacent to the weld leg, and the reaction particle may react with the weld leg when the circuit board is energized and in an environment with water, so that an insoluble protection layer is formed on the outer surface of the weld leg. In this embodiment of this application, a form, a density, a location, and the like of the reaction particle are not strictly and specifically required. Therefore, disposing of the reaction particle is not easily limited by a geometric appearance of the circuit board, and is not easily affected by a component that needs to be exposed outside, such as an antenna and an electrical connection point. Therefore, a disposing process of the reaction particle on the board body is more flexible, simple, and easy to operate, so that a production process of the circuit board and the electronic device is also simple, and production costs of the circuit board and the electronic device are relatively low.

In addition, a form of the reaction particle is relatively flexible, the reaction particle does not need to have an isolation function, and there is no need to set a very large density. Therefore, disposing of the reaction particle is not easy to cause an obstacle to radiation of an antenna, and a radiation function of the antenna is not easy to be affected, so that reliability of a wireless communication function of the electronic device is better.

In an optional design, the disposing a reaction particle at a location, on a surface of the board body, which is adjacent to a weld leg for welding the electronic component to obtain the circuit board includes:
   placing the board body welded with the electronic component in an environment of a solution containing the reaction particle, so that the solution of the reaction particle is adsorbed on the surface of the board body; and
   drying the board body on which the solution is adsorbed to obtain the circuit board.

The solution containing the reaction particle may be a saturated solution, or may be an unsaturated solution. For example, a volume ratio of the solution containing the reaction particle may be in a range from 1% to 10%, that is, the saturated solution containing the reaction particle of 1 to 10 volumes is added to 100 volumes of solvent (water or alcohol), to form the solution. The volume ratio of the solution containing the reaction particle may also be another ratio, which is not specifically limited in this application.

The solution containing the reaction particle may be an aqueous solution, or may be an alcoholic solution. The alcoholic solution is obtained by dissolving the reaction particle in alcohol, and the aqueous solution is obtained by dissolving the reaction particle in water.

An environment of the solution containing the reaction particle may be in an original state (that is, a liquid state) environment of a solution, or may be a steam environment or a vapor environment generated when a solution changes a physical form after processing such as evaporation or atomization.

In this embodiment, the solution containing the reaction particle is adsorbed on the board body and then dried to obtain the circuit board, so that the reaction particle can be conveniently disposed on the surface of the board body. In the solution of the reaction particle, the reaction particle is evenly distributed. Therefore, in this embodiment, the reaction particle disposed on the surface of the board body can further be more evenly distributed, so that when the circuit board is energized and meets water, an insoluble protection layer with good uniformity can be formed on each part of the surface of the weld leg, and each part of the outer surface of the weld leg cannot contact water, thereby reducing a probability of dendrite corrosion of the weld leg.

In an optional design, the placing the board body welded with the electronic component in an environment of a solution containing the reaction particle includes:
   soaking the board body welded with the electronic component in the solution containing the reaction particle.

In this embodiment, the board body is directly soaked in the solution containing the reaction particle, and the solution may be adsorbed on the surface of the board body simply and conveniently. Therefore, a process for disposing the reaction particle on the surface of the board body is simpler, so that a production process of the circuit board and the electronic device is simpler, and production costs are lower.

In an optional design, the placing the board body welded with the electronic component in an environment of a solution containing the reaction particle includes:
   atomizing the solution containing the reaction particle; and
   placing the board body welded with the electronic component in an atomized solution.

In this embodiment, the board body is placed in the atomized solution of the reaction particle, so that the process for disposing the reaction particle on the surface of the board body is simple and convenient. Therefore, a production process of the circuit board and the electronic device is simpler, and production costs are lower. In addition, a density of the atomized solution is relatively low, and the board body is placed in the atomized solution, which can make the board body not too wet after the solution of the reaction particle is adsorbed on the board body, so that the board body can be quickly dried. Therefore, production efficiency of the circuit board is improved, and a probability that the solution of the reaction particle soaks inside each electronic component to make the electronic component damaged is reduced, so that reliability of the circuit board and the electronic device is higher, and a fault rate is lower.

In an optional design, the disposing a reaction particle at a location, on a surface of the board body, which is adjacent to a weld leg for welding the electronic component includes:
   disposing the reaction particle on the outer surface of the weld leg for welding the electronic component.

In an optional design, before the disposing a reaction particle at a location, on a surface of the board body, which is adjacent to a weld leg for welding the electronic component, the method further includes:
   covering the surface of the board body on which the electronic component is installed with a barrier, where the barrier covers the board body except each weld leg, so as to prevent the reaction particle from being disposed on the surface of the board body except each weld leg.

The barrier may be a dam board, a housing, a barrier film, and the like. A plurality of through-holes are disposed in the barrier, a size of each through-hole is corresponding to a size of each weld leg, and the through-hole is used to make the weld leg exposed, so as to facilitate disposing of the reaction particle.

In this embodiment, by using the barrier, the board body except the weld leg can be covered, so as to prevent the reaction particle from being disposed on a part except the weld leg, thereby reducing impact of the reaction particle on the circuit board except the weld leg, and improving structural stability and reliability of the circuit board.

In an optional design, the disposing a reaction particle at a location, on a surface of the board body, which is adjacent to a weld leg for welding the electronic component includes:
   sputtering, by using a sputtering method, and adsorbing the reaction particle at the location, on the surface of the board body, which is adjacent to the weld leg for welding the electronic component.

A process of disposing the reaction particle on the surface of the board body by using the sputtering method may be specifically: filling a vacuum coating chamber with a proper amount of argon gas, placing a target material of the reaction particle at a location close to a cathode, applying a voltage between a cathode board and an anode board, and rapidly increasing energy of an electron emitted from a surface of the cathode board by means of acceleration of an electric field. A high-energy electron can collide with the argon gas to decompose a positive argon ion. Under an effect of the electric field, the argon ion moves to the cathode board and the target material of the reaction particle to bombard a surface of the target material of the reaction particle, and the reaction particle in the target material of the reaction particle obtains energy from bombardment, and is finally discharged from the target material of the reaction particle to sputter on the board body.

In this embodiment, the reaction particle may be directly sputtered and adsorbed on the surface of the board body by using the sputtering method, and no drying or another subsequent processing process is required, so that a production process of the circuit board has fewer steps and a simpler process. In addition, by using the sputtering method, the board body is always in a dry environment, so that a process of disposing the reaction particle does not affect another part of the circuit board, and reliability of the circuit board is higher. In addition, by using the sputtering method, a film of the reaction particle with a more uniform thickness and better densification can be formed on the surface of the board body, so that when the circuit board is energized and meets water, an insoluble protection layer with better uniformity can be formed on the weld leg.

In an optional design, the method further includes:

energizing the circuit board and placing the circuit board in an environment with water, so that the reaction particle reacts with the weld leg to form the insoluble protection layer on the outer surface of the weld leg.

In this implementation, when the circuit board is energized, the circuit board is soaked in water, or water is sprayed on the circuit board, or the circuit board is placed in vapor or water after atomization, so that the reaction particle reacts with the weld leg to form the insoluble protection layer on the outer surface of the weld leg.

In this implementation, the circuit board may be energized first, and then placed in an environment with water, or the circuit board may be placed in an environment with water first and then energized, or the circuit board is energized, and at the same time, placed in an environment with water. This is not specifically limited in this application.

In this embodiment, the insoluble protection layer is formed on the outer surface of the weld leg, and the weld leg can be isolated from water, so that dendrite corrosion of the weld leg can be prevented.

In an optional design, the disposing a reaction particle at a location, on a surface of the board body, which is adjacent to a weld leg for welding the electronic component, and energizing the circuit board and placing the circuit board in an environment with water includes:

energizing the board body on which the electronic component is installed, and placing the board body in an environment of a solution containing the reaction particle, so that the reaction particle reacts with the weld leg to form the insoluble protection layer on the outer surface of the weld leg, to obtain the circuit board.

In this embodiment, when the board body is energized, the board body is placed in the environment of the solution containing the reaction particle. In this way, when the reaction particle is attached to the surface of the board body, the insoluble protection layer is formed on the outer surface of the weld leg. In this way, a process of forming the insoluble protection layer is simultaneously performed with the process of disposing the reaction particle, which reduces a production process step of the circuit board, and makes a production process of the circuit board simpler.

In an optional design, the method further includes:

cleaning and drying the circuit board formed with the insoluble protection layer.

Specifically, the circuit board may be cleaned by using an ultrasonic cleaning machine, or may be cleaned by using a washing machine. A cleaning solution may be water, or may be an alcoholic solution.

In this embodiment, the reaction particle remaining on the circuit board, the reaction particle and the weld leg, and an intermediate product generated in a process of water reaction may be washed off, so that impact of these substances on performance of the circuit board can be reduced.

In an optional design, the reaction particle is a compound, and anionic reducibility of the compound is higher than that of tin.

In this embodiment, because anionic reducibility of the reaction particle is higher than that of tin, when electrochemical corrosion occurs, an electron loss capability of anion of the reaction particle is stronger than that of tin. The anion of the reaction particle is oxidized before tin, so as to suppress oxidization and dissolving of the tin weld leg, thereby further reducing a probability that the tin weld leg is oxidized and dissolved to a tin particle, and reducing a probability of dendrite corrosion of the weld leg.

In an optional design, the compound is a sulfide or an iodide.

Because anions in the sulfide and the iodide are sulfur ions and iodine ions, after the sulfur ions or the iodine ions are oxidized to a sulfur or iodine elementary substance, the sulfur or iodine elementary substance may further react with the tin weld leg quickly to form a tin disulfide protection layer or a tin tetraiodide protection layer, thereby increasing a speed and a probability of forming the insoluble protection layer, so that the generated insoluble protection layer can better cover the outer surface of the weld leg to make the weld leg better isolate from water, and a probability of the weld leg being oxidized and dissolved is further reduced, thereby reducing a probability of dendrite corrosion of the weld leg.

In an optional design, the insoluble protection layer is a tin sulfide protection layer or a tin iodide protection layer.

Because tin sulfide or tin iodide is not dissolvable in water, when the insoluble protection layer is a tin sulfide protection layer or a tin iodide protection layer, the insoluble protection layer may be more reliably attached to the surface of the weld leg, and the insoluble protection layer may more reliably isolate the weld leg from water, thereby better preventing dendrite corrosion of the weld leg.

In an optional design, the reaction particle is dissolvable in water.

In this embodiment, because the reaction particle is dissolvable in water, when the circuit board is in an environment with water, the reaction particle can be more evenly distributed in water after being dissolved in water, and can be more evenly distributed in water attached on the outer surface of the weld leg, so that the reaction particle in water can react with each part of the outer surface of the weld leg more evenly. Each part of the outer surface of the weld leg can quickly and evenly form an insoluble protection layer, so that each part of the outer surface of the weld leg cannot contact water, thereby reducing a probability of dendrite corrosion of the weld leg.

BRIEF DESCRIPTION OF THE DRAWINGS

FIG. 5 is an iodide, and reaction occurs when the circuit board is energized and in an environment with water;

Figure 1:
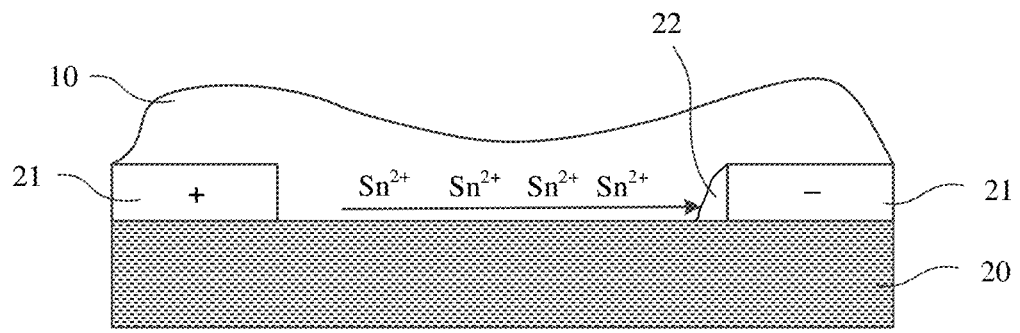
FIG. 1 is a schematic diagram of a process in which dendrite corrosion occurs on a weld leg of a circuit board.

Meanings represented by reference numerals of the accompanying drawings are respectively as follows:

10. water; 20. board body; 21. weld leg; 22. dendrite;
100. housing; 200. display screen; 300. circuit board; 310. board body; 320. electronic component; 330. reaction particle; 340. weld leg;
333. insoluble protection layer; 333a. tin iodide protection layer; 333b. tin sulfide protection layer; and
901. lifting mechanism; 902. box; 903. atomizer; 904. pipeline; 905. solution of a reaction particle; 906. anode board; 907. target material of a reaction particle; 908. magnet; 909. cathode board.

DETAILED DESCRIPTION OF ILLUSTRATIVE EMBODIMENTS

The following describes the technical solutions in this application with reference to the accompanying drawings. Clearly, the described embodiments are only some, but not all, embodiments of this application.

In the description of this application, it should be noted that, unless otherwise specified and limited, the terms "install", "connection", and "connect" should be understood in a broad sense, for example, may be a fastened connection, may be a detachable connection, or may be integrally connected; may be a mechanical connection, may be an electrical connection, or may communicate with each other; may be directly connected, or may be indirectly connected by using an intermediate medium, or may be connected inside two components or an interaction relationship between the two components. A person of ordinary skill in the art may understand a specific meaning of the foregoing term in this application according to a specific situation.

In the description of this application, it should be understood that an orientation or location relationship indicated by the terms "upper", "lower", "side", "inner", "outer", "top", "bottom" is an installation-based orientation or location relationship, which is merely intended to facilitate description and simplify description of this application, and is not intended to indicate or imply that the referred apparatus or component must have a specific orientation, and be constructed and operated in a specific orientation. Therefore, it cannot be understood as a limitation on this application.

It should be further noted that in the embodiments of this application, a same reference numeral indicates a same component part or a same part. For a same part in the embodiments of this application, only one part or component may be used as an example in the figure to mark a reference numeral. It should be understood that, for another same part or component, the reference numeral is also applicable.

In the following, the terms "first", "second", and the like are used only for description purposes, and cannot be understood to indicate or imply relative importance or implicitly indicate the quantity of indicated technical features. Therefore, a feature defined as "first", "second", or the like may explicitly or implicitly include one or more of the features.

In the description of this application, it should be noted that the term "and/or" is merely an association relationship that describes an associated object, and indicates that three relationships may exist. For example, A and/or B may indicate three conditions that only A exists, A and B exist simultaneously, or only B exists.

It should be further noted that in the embodiments of this application, a same reference numeral indicates a same component part or a same part. For a same part in this embodiment of this application, only one part or component may be used as an example in the figure to mark a reference numeral. It should be understood that, for another same part or component, the reference numeral is also applicable.

A circuit board is a main component for an electronic product to implement various functions. The circuit board generally includes a board body and an electronic component that is fastened to the board body by welding of soldering tin. A tin weld leg used to fasten the electronic component exists on an outer surface of the board body. When there is water or moisture entering the electronic device, the tin weld leg on the outer surface of the board body is often subject to dendrite corrosion in a case of electrification. The following describes a dendrite corrosion process of a weld leg.

Figure 2:
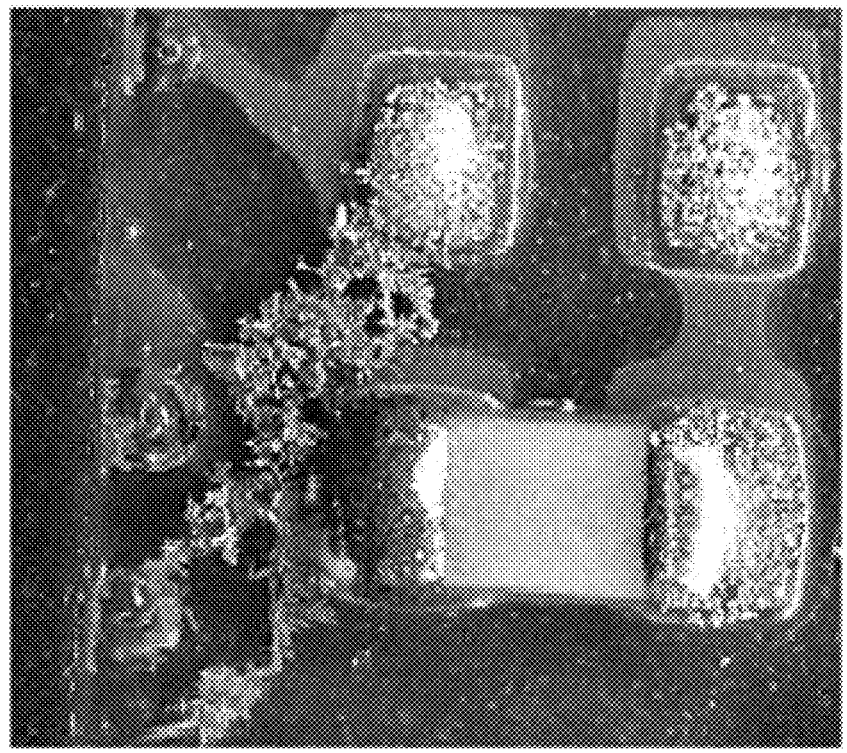
FIG. 2 is a physical diagram of a weld leg of a circuit board after dendrite corrosion.

FIG. 1 is a schematic diagram of a process in which dendrite corrosion occurs on a weld leg of a circuit board, and FIG. 2 is a physical diagram of a weld leg of a circuit board after dendrite corrosion;

As shown in FIG. 1, when a board body 20 of a circuit board is energized, a weld leg 21 connected to a positive electrode of a power supply is an anode (that is, the "+" electrode in FIG. 1), and a weld leg 21 connected to a negative electrode of the power supply is a cathode (that is, the "−" electrode in FIG. 1). When the circuit board is in an environment with water 10, the weld leg 21 is easily subject to electrochemical corrosion, and the electrochemical corrosion can cause an anodic weld leg 21 to be oxidized and dissolved.

A specific process of the electrochemical corrosion is as follows: The anodic weld leg 21 loses electrons and is oxidized to tin ions, and oxidation reaction occurs on the anode. Oxygen of the cathode obtains electrons and combines with water to form a hydroxide ion, and reduction reaction occurs on the cathode. Because tap water is usually sterilized by chlorine gas, chlorine gas can be dissolved in water to form hydrogen chloride, so tap water is usually slightly acidic. Hydrogen ions exist in tap water. When a hydrogen ion exists in the water 10, the cathode may be further subject to reaction in which the hydrogen ion obtains electrons to generate hydrogen gas.

A reaction equation of anode reaction during an electrochemical corrosion process is $Sn-2e=Sn^{2+}$;

a reaction equation of cathode reaction during the electrochemical corrosion process is $2H^{+}+2e=H_2,O_2+2H_2O+4e=4OH^{-}$.

After a tin ion is generated due to electrochemical corrosion, as shown in FIG. 1, because the tin ion is a cation, the tin ion moves toward the cathode due to an electric potential difference between the anode and the cathode. Because there is a relatively large quantity of electrons at the cathode, the tin ion easily obtains electrons at the cathode to restore and generate a tin elementary substance, the tin elementary substance generates a dendrite 22 at the cathode, and dendrite corrosion occurs. A reaction equation for reducing the tin ion to generate the tin elementary substance at the cathode is $Sn^{2+}+2e=Sn\downarrow$.

As shown in FIG. 1 and FIG. 2, continuous generation of the dendrite 22 easily causes a connection among different weld legs 21, and causes a short circuit, which causes a part of functions of an electronic product to fail, thereby affecting reliability of the electronic product.

In a related technology, to suppress dendrite corrosion of the weld leg 21 on the circuit board, an outer surface of the circuit board is usually covered with an insulation layer, so as to prevent the weld leg 21 from contacting water 10 to cause dissolution, thereby avoiding dendrite corrosion of the weld leg 21.

However, when each electronic component is installed on the circuit board, a geometric appearance of the outer surface of the circuit board is often complex. In addition, there are a relatively large quantity and variety of electronic components on the circuit board, and a radio frequency antenna and a relatively large quantity of electrical connection points, which cannot be covered by the insulation layer, are disposed on the outer surface of the circuit board. Therefore, a disposing process of the insulation layer is relatively complex, and consequently, costs of an electronic product are relatively high.

In addition, because there is a relatively low probability of water or moisture entering the electronic device, insulation layers of most electronic products do not function when in use. If an isolation layer is disposed on a circuit board for each electronic product, costs are further increased.

To solve the foregoing problem, embodiments of this application provide a circuit board, an electronic device, and a production method for a circuit board, so as to reduce costs of the electronic device, and further prevent dendrite corrosion of a weld leg on the circuit board.

The following describes an electronic device and a circuit board provided in embodiments of this application.

In the embodiments of this application, the electronic device may be a device with a circuit board, such as a mobile phone (for example, a common mobile phone or a foldable mobile phone), a wireless headset, a wristband, a smart sound box, a tablet computer, a notebook computer, a desktop computer, a watch, a digital camera, a personal digital assistant (personal digital assistant, PDA), a point of sales (point of sales, POS), an in-vehicle computer, a television, a router, a drone, and the like, but is not limited thereto. In the embodiments of this application, a mobile phone is used as an example for description.

Figure 3:
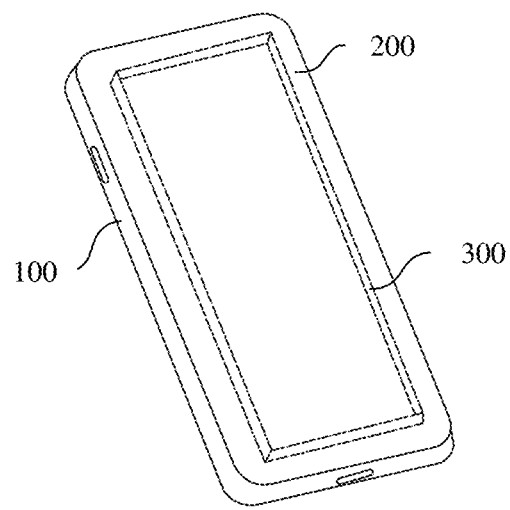
FIG. 3 is a schematic diagram of a structure of an electronic device according to an embodiment of this application.

FIG. 3 is a schematic diagram of a structure of an electronic device according to an embodiment of this application. As shown in FIG. 3, the electronic device includes a housing 100, a display screen 200, and a circuit board 300. The display screen 200 and the circuit board 300 are installed on the housing 100.

Specifically, the housing 100 may include a frame and a rear cover, and the frame surrounds a periphery of the display screen 200, and surrounds a periphery of the rear cover. The display screen 200 and the rear cover are disposed at intervals. The circuit board 300 may be installed in a cavity formed among the display screen 200, the frame, and the rear cover. The housing 100 may be a metal housing 100, a metal housing 100 such as a magnesium alloy or stainless steel. In addition, the housing 100 may be a plastic housing 100, a glass housing 100, a ceramic housing 100, or the like, but is not limited thereto.

The display screen 200 may be a light emitting diode (light emitting diode, LED) display screen, a liquid crystal display (liquid crystal display, LCD), an organic light-emitting diode (organic light-emitting diode, OLED) display screen, a touch panel-liquid crystal display (touch panel-liquid crystal display, TP-LCD), or the like, but is not limited thereto. In addition, the display screen 200 may further be a foldable screen (a flexible screen).

Figure 4:
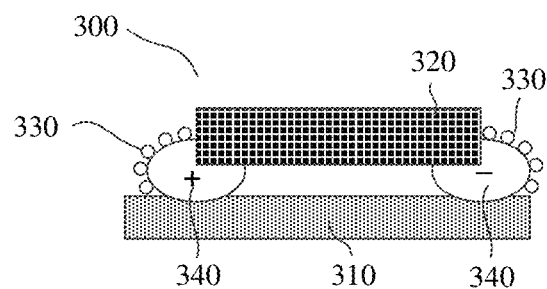
FIG. 4 is a schematic diagram of a structure of a circuit board of the electronic device shown in FIG. 3.

FIG. 4 is a schematic diagram of a structure of the circuit board 300 of the electronic device shown in FIG. 3. As shown in FIG. 4, the circuit board 300 includes a board body 310, an electronic component 320, and a reaction particle 330.

The electronic component 320 is welded to a surface of the board body 310 by using soldering tin, the reaction particle 330 is disposed on the surface of the board body 310, and the reaction particle 330 is adjacent to a weld leg 340 for welding the electronic component 320. When the circuit board 300 is energized and in an environment with water, the reaction particle 330 reacts with the weld leg 340 to form an insoluble protection layer 333 on the outer surface of the weld leg 340, and the insoluble protection layer 333 isolates the weld leg 340 from contacting water to prevent dendrite corrosion of the weld leg 340.

The board body 310 may also be referred to as a circuit board. The board body 310 may include a substrate and a conducting layer, and the conducting layer is fastened to the substrate. A connector may be disposed on a surface of the substrate, one end of the connector is electrically connected to the conducting layer, the other end of the connector passes through the substrate and is located on an outer surface of the substrate, and the other end of the connector is configured to be electrically connected to a pin of the electronic component 320. Specifically, the connector may be a bonding pad. A material of the substrate is an insulation material, and the insulation material may be, for example, a resin, a glass fiber, or another insulation material. The conducting layer may be a metal foil, for example, a copper foil. The conducting layer is configured to form wiring in the circuit board 300, or the conducting layer may be another conductive material.

According to wiring distribution, the board body 310 may be a single-layer board, dual-layer board, or multi-layer board. When the board body 310 is a multi-layer board, the board body 310 includes a multi-layer conducting layer and a multi-layer substrate, and the multi-layer conducting layer and the multi-layer substrate are alternately stacked. According to a property of the substrate, the board body 310 may be a rigid board, or may be a flexible board. The board body 310 in this embodiment of this application may be a printed circuit board (printed circuit board, PCB).

The electronic component 320 may include a power management unit (power management unit, PMU), a radio frequency integrated circuit (radio frequency integrated circuit, RFIC), a radio frequency power amplifier (radio frequency power amplifier, RFPA), a wireless-fidelity (wireless-fidelity, WIFI) chip, a resistor, a capacitor, an inductor, a transistor, a processor, a memory, a camera, a flash lamp, a microphone, a speaker, a battery, and the like, but is not limited thereto.

The electronic component 320 may be electrically connected to the board body 310. Specifically, an electrical connection end of the electronic component 320 may be welded to a connector (for example, a bonding pad) on the board body 310, so as to implement electrical connection between the electronic component 320 and the board body 310. There is the weld leg 340 on the surface of the board body 310 for welding the electronic component 320 on the board body 310. Solder for welding the electronic component 320 is soldering tin.

Optionally, the electronic component 320 may be a sheet-like component, and the sheet-like component may be electrically connected to the board body 310 by using a surface mount technology (surface mount technology, SMT). The SMT is a circuit installation and connection technology in which a sheet-like component is attached and installed on the surface of the board body 310, and implement welding and assembly by using a welding process such as reflow soldering or dip soldering. The SMT has a feature of high production efficiency, high reliability of installing the electronic component 320, and high assembly density. The sheet-like component is a new micro component without leads or with short leads, and is a dedicated component for the SMT.

The reaction particle 330 may be disposed at a location, on the surface of the board body 310, where the weld leg 340 is not disposed, and the reaction particle 330 is adjacent to the weld leg 340, that is, there is a distance between the reaction particle 330 and the weld leg 340. It may be understood that the distance between the reaction particle 330 and the weld leg 340 should not be too long, to ensure that when the circuit board 300 is energized and in an environment with water, the reaction particle 330 can react with the weld leg 340 to form the insoluble protection layer 333. For example, the distance between the reaction particle 330 and the weld leg 340 may be 0.5 mm, 1 mm, or 2 mm, but is not limited thereto.

When there is a distance between the reaction particle 330 and the weld leg 340, if the circuit board 300 is in an environment with water, the reaction particle 330 can move in water due to an electric potential difference between cathodic and anodic weld legs 340, so as to move to a location contacting the weld leg 340 to react with the weld leg 340 to form the insoluble protection layer 333.

In a specific embodiment, the reaction particle 330 may be disposed on the outer surface of the weld leg 340, that is, the distance between the reaction particle 330 and the weld leg 340 is 0. The reaction particle 330 is directly disposed on the outer surface of the weld leg 340, and the reaction particle 330 contacts the weld leg 340. In this way, in a case in which the circuit board 300 meets water and is energized, the reaction particle 330 may react rapidly with the weld leg 340 to form the insoluble protection layer 333, and a probability of the weld leg 340 being oxidized and dissolved is reduced, thereby reducing a probability of dendrite corrosion of the weld leg 340. In addition, in this embodiment, there is no need to dispose the reaction particle 330 on the surface of the board body 310 except the weld leg 340, thereby reducing impact of the reaction particle 330 on the board body 310 and making the circuit board 300 more reliable.

In a specific embodiment, the reaction particle 330 may alternatively be attached to an entire outer surface of the board body 310 and the weld leg 340, so that a disposing process of the reaction particle 330 is simpler.

The insoluble protection layer 333 is not dissolvable in water, is attached to the outer surface of the weld leg 340, and covers the outer surface of the weld leg 340, so as to isolate the weld leg 340 from water.

The reaction particle 330 may be attached to the outer surface of the weld leg 340 in a form of a film, a particle, or powder. The reaction particle 330 may form a film with relatively good densification on the outer surface of the weld leg 340, or may be attached to the outer surface of the weld leg 340 in a form of a particle or powder dispersedly. In this embodiment of this application, the reaction particle 330 can react with the weld leg 340 to form the insoluble protection layer 333 that covers the surface of the weld leg 340, and a specific disposing form of the reaction particle 330 is not limited.

Because a process of attaching the reaction particle 330 in the form of powder or a particle to the surface of the board body 310 is relatively simple, the reaction particle 330 is attached to the surface of the board body 310 in the form of the powder or particle, which may make a production process of the circuit board 300 and the electronic device simpler, thereby reducing costs of the circuit board 300 and the electronic device.

The reaction particle 330 may be attached to the surface of the board body 310 or the surface of the weld leg 340 by using an intermolecular adsorption force, so that when the circuit board 300 is energized and in an environment with water, the reaction particle 330 can move away from an attachment surface and move more flexibly due to a potential difference between the anode and the cathode, to react with the weld leg 340 to form the insoluble protection layer 333 more evenly, so that the formed insoluble protection layer 333 covers the outer surface of the weld leg 340 more evenly.

The reaction particle 330 may alternatively be attached to the surface of the board body 310 in a bonding manner or in another manner, which is not specifically limited in this application.

The reaction particle 330 may be an elementary substance, or may be a compound. A tin compound that is not dissolvable in water generally includes: tin sulfide and tin iodide. Therefore, the reaction particle 330 may be a sulfur or iodine elementary substance, or the reaction particle 330 may be a compound such as sulfide or iodide. The reaction particle 330 may be a pure substance, or may be a compound.

For example, the reaction particle 330 may include: a combination of one or more of an iodine elementary substance, a sulfur elementary substance, sodium sulfide, magnesium sulfide, potassium sulfide, sodium iodide, potassium iodide, and calcium iodide, and is not limited thereto. When the reaction particle 330 includes only one of the foregoing substances, the reaction particle 330 is a pure substance. When the reaction particle 330 includes a plurality of the foregoing substances, the reaction particle 330 is a compound. To facilitate disposing of the reaction particle 330, the reaction particle 330 may be an elementary substance. When the circuit board 300 is energized and has water, the reaction particle 330 can react with the weld leg 340 (that is, tin) to form a precipitate, and a specific component of the reaction particle 330 is not limited.

Because dendrite corrosion is reaction that occurs only in an environment with water, when the circuit board 300 is in an environment which has no water or is dry, there is no chemical reaction between the reaction particle 330 on the surface of the weld leg 340 and the weld leg 340, that is, the reaction particle 330 and the weld leg 340 remain their own states. In this way, intermediate substances generated by chemical occurrence between the weld leg 340 and the reaction particle 330 can be reduced, so that impact of these intermediate substances on performance of the circuit board 300 can be reduced.

In this embodiment of this application, when the circuit board 300 is energized and is in an environment with water, the reaction particle 330 may react with at least one weld leg 340 to form an insoluble protection layer 333 on an outer surface of the weld leg 340. Because reduction reaction occurs at the cathode in a reaction process, and the weld leg 340 and the reaction particle 330 are usually easy to have oxidization reaction, the reaction particle 330 generally chemically reacts with the weld leg 340 to form an insoluble protection layer 333 at the anode, and the reaction particle 330 at the cathode generally does not chemically react with the weld leg 340 to form an insoluble protection layer 333. Therefore, when the circuit board 300 is energized and is in an environment with water, the insoluble protection layer 333 can generally be formed on the surface of the weld leg 340 at each anode, and the insoluble protection layer 333 is generally not easily formed on the surface of the weld leg 340 at each cathode. Because the weld leg 340 at the cathode is not to be oxidized and dissolved, even if the surface of the weld leg 340 at the cathode does not form the insoluble protection layer 333, the weld leg 340 at the cathode is not to be dissolved to cause electrochemical corrosion.

Figure 5:
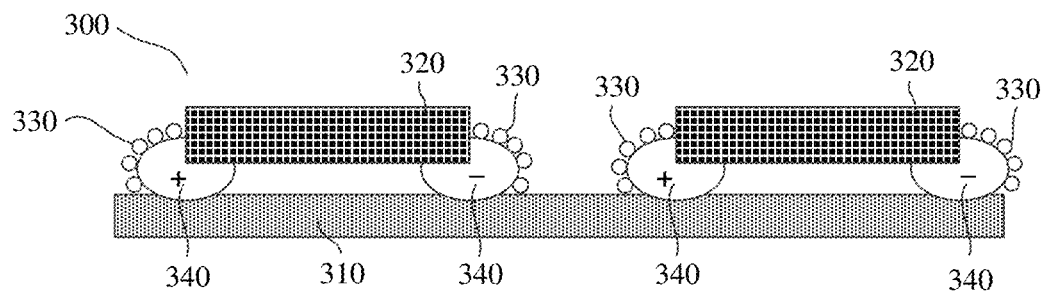
FIG. 5 is another schematic diagram of a structure of a circuit board of the electronic device shown in FIG. 3.

FIG. 5 is another schematic diagram of a structure of the circuit board 300 of the electronic device shown in FIG. 3.

In this embodiment of this application, the electronic component 320 shown in FIG. 4 may be welded to the board body 310, and a plurality of electronic components 320 shown in FIG. 5 may be welded to the board body 310.

When the plurality of electronic components 320 shown in FIG. 5 are welded to the board body 310, electrochemical reaction may occur between two weld legs 340 with different polarities of a same electronic component 320, and electrochemical reaction may also occur between two weld legs 340 with opposite polarities corresponding to two adjacent electronic components 320.

The reaction particle 330 of the circuit board 300 provided in this embodiment of this application is adjacent to the weld leg 340 for welding the electronic component 320. When the circuit board 300 is energized and in an environment with water, the reaction particle 330 reacts with the weld leg 340 to form the insoluble protection layer 333 on the outer surface of the weld leg 340. In this way, the insoluble protection layer 333 can isolate the weld leg 340 from water, to prevent the weld leg 340 from contacting water. In this way, when there is water on the circuit board 300, dendrite corrosion of the weld leg 340 can be prevented.

In addition, in this embodiment of this application, the reaction particle 330 only needs to be attached to a location, on the surface of the board body 310, adjacent to the weld leg 340, and may react with the weld leg 340 when the circuit board 300 is energized and in an environment with water, so that the insoluble protection layer 333 is formed on the outer surface of the weld leg 340. In this embodiment of this application, a form, a density, a location, and the like of the reaction particle 330 are not strictly and specifically required. Therefore, disposing of the reaction particle 330 is not easily limited by a geometric appearance of the circuit board 300, and is not easily affected by a component that needs to be exposed outside, such as an antenna and an electrical connection point. Therefore, a disposing process of the reaction particle 330 on the board body 310 is more flexible, simple, and easy to operate, so that a production process of the circuit board 300 and the electronic device is also simple, and production costs of the circuit board 300 and the electronic device are relatively low.

In addition, a form of the reaction particle 330 is relatively flexible, the reaction particle 330 does not need to have an isolation function, and there is no need to set a very large density. Therefore, disposing of the reaction particle 330 is not easy to cause an obstacle to radiation of the antenna, and a radiation function of the antenna is not easy to be affected, so that reliability of a wireless communication function of the electronic device is better.

In one implementation, the reaction particle 330 may be a compound, and anionic reducibility of the compound is higher than that of tin.

When reducibility of a substance is relatively high, that is, an electron loss capacity of the substance is relatively high, and the substance is more easily oxidized.

A capability of an elementary substance to gain and lose electrons can be evaluated by electronegativity. Electronegativity is a relative scale of a capability of an atom of each element in the periodic table of elements to attract an electron. When electronegativity of an element is higher, a tendency of attracting an electron is higher, and a nonmetallic attribute is stronger. In the periodic table of elements, electronegativity of elements from left to right increases in a same period, and electronegativity of elements from top to bottom decreases in a same main group. Therefore, elements with high electronegativity are concentrated in the upper right corner of the periodic table of elements, and elements with low electronegativity are concentrated in the lower left corner.

A nonmetallic element with higher electronegativity is more active, and a metallic element with lower electronegativity is more active. Because a substance that reacts with tin to generate a tin compound is a nonmetallic element, a reducibility order of nonmetallic anions can be determined according to electronegativity/activity: $S^{2-}>I^->Br^->B^->Cl^-\rightarrow OH^->$oxygenated acid ions$>Sn^{2-}$.

Products are Br and B after $Br^-$ and $B^-$ lose electrons, and a product generated by reaction between which Br and tin is easy to dissolve in water. B is not easy to react with tin, and $B^-$ is also not easy to react with a tin ion to generate a stable compound. Products of oxidized $Cl^-$ and oxygenated acid ions are water and gas, and water and gas cannot react with tin to generate an insoluble protection layer 333. A compound generated after $Cl^-$ and oxygenated acid ions combine with tin ions is easy to dissolve in water, so $Br^-$, $B^-$, $Cl^-$ and oxygenated acid ions cannot react with tin or tin ions to generate an insoluble protection layer 333 when losing electrons and not losing electrons.

$OH^-$ can react with tin ions to generate $Sn(OH)_4$. Because $Sn(OH)_4$ is difficult to dissolve in water, when less water is on the circuit board 300, generally, an insoluble protection layer can be formed on the surface of the weld leg 340 by $Sn(OH)_4$.

Products are S and $I_2$ after $S^{2-}$ and $I^-$ lose electrons. S and $I_2$ can react with tin to generate $SnS_2$ and $SnI_4$. $SnS_2$ and SnI$_4$ are not dissolvable in water, so that SnS$_2$ and SnI$_4$ are easy to form an insoluble protection layer 333 on the surface of the weld leg 340. The reaction particle 330 may be a sulfide, an iodide, a complex containing iodine (such as iohexol), or a complex containing sulfur. Anion of the sulfide and the complex containing sulfur is S$^{2-}$, and anion of the iodide and the complex containing iodine is I-.

For a specific compound component of the reaction particle 330, refer to the foregoing compound. Details are not described herein again.

In this embodiment of this application, when the reaction particle 330 is a sulfide or an iodide, because reducibility of a sulfur ion and an iodine ion is higher than that of tin, the sulfur ion and the iodine ion can be oxidized before tin, to suppress oxidization and dissolving of tin into the tin ion, so as to suppress electrochemical corrosion on the tin weld leg 340 to form a dendrite. In addition, after a sulfur ion or an iodine ion is oxidized to a sulfur or iodine elementary substance, the sulfur or iodine elementary substance may further react with the tin weld leg 340 to form a tin sulfide protection layer or a tin iodide protection layer, thereby improving a probability of forming the insoluble protection layer 333, so that the generated insoluble protection layer 333 can better cover the outer surface of the weld leg 340 to make the weld leg 340 better isolate from water, and a probability of the weld leg 340 being oxidized and dissolved is further reduced, thereby reducing a probability of dendrite corrosion of the weld leg 340.

In this embodiment, because anionic reducibility of the reaction particle 330 is higher than that of tin, when electrochemical corrosion occurs, an electron loss capability of anion of the reaction particle 330 is stronger than that of tin. The anion of the reaction particle 330 is oxidized before tin, so as to suppress oxidization and dissolving of the tin weld leg 340, thereby further reducing a probability that the tin weld leg 340 is oxidized and dissolved to a tin particle, and reducing a probability of dendrite corrosion of the weld leg 340.

In a specific embodiment, the reaction particle 330 may be salt. The salt refers to a compound combined by a metallic ion or an ammonium ion (NH$^{4+}$) with an acid radical ion or a nonmetallic ion, and is usually neutral in acid-base property. Because the acid-base property of salt is neutral, when the reaction particle 330 is salt, corrosion on the circuit board 300 may be reduced, so that reliability of the circuit board 300 is higher. For example, the reaction particle 330 may be potassium sulfide, sodium iodide, potassium iodide, or the like, but is not limited thereto.

In one implementation, the reaction particle 330 may be a substance that is dissolvable in water.

For example, the reaction particle may be any one of sodium sulfide, potassium sulfide, sodium iodide, potassium iodide, calcium iodide, or potassium hydroxide, but is not limited thereto.

Because the reaction particle 330 is dissolvable in water, when the circuit board 300 is in an environment with water, the reaction particle 330 can be more evenly distributed in water after being dissolved in water, and can be more evenly distributed in water attached on the outer surface of the weld leg 340, so that the reaction particle 330 in water can react with each part of the outer surface of the weld leg 340 more evenly. Each part of the outer surface of the weld leg 340 can quickly and evenly form the insoluble protection layer 333, so that each part of the outer surface of the weld leg 340 cannot contact water, thereby reducing a probability of dendrite corrosion of the weld leg 340.

The following describes, by using a specific example, a process in which when the circuit board 300 is energized and in an environment with water, the reaction particle 330 reacts with the weld leg 340 to form the insoluble protection layer 333 in this embodiment of this application.

Figure 6:
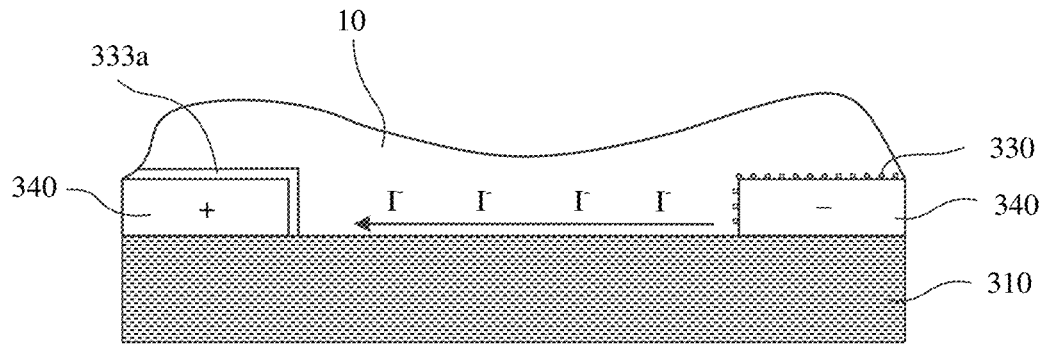
FIG. 6 is a schematic diagram in which a reaction particle of the circuit board in FIG. 4

FIG. 6 is a schematic diagram in which the reaction particle 330 of the circuit board 300 shown in FIG. 4 or FIG. 5 is a potassium iodide particle, and reaction occurs when the circuit board 300 is energized and in an environment with water 10. Two weld legs 340 in FIG. 6 may be two weld legs 340 with different polarities of a same electronic component 320 in FIG. 4 or FIG. 5, or may be two weld legs 340 with different polarities corresponding to two adjacent electronic components 320 in FIG. 5. In this example, when the circuit board 300 is in an environment with water, the potassium iodide particle is easily dissolved in water 10 and decomposed into iodine ions and potassium ions.

The reaction particle 330 is disposed on the outer surface of the weld leg 340. As shown in FIG. 6, when the circuit board 300 is in an environment with water 10, water 10 is attached to an outer surface of the board body 310 and the weld leg 340. When the circuit board 300 is energized, one weld leg 340 is an anode (that is, a "+" electrode in FIG. 6), and another weld leg 340 is a cathode (that is, a "-" electrode in FIG. 6).

A specific reaction process is as follows: Tin of the weld leg 340 at the anode loses an electron to become a tin ion, an iodine ion loses an electron to become an iodine elementary substance, and the iodine elementary substance reacts with the tin of the weld leg 340 to form a tin iodide insoluble substance. The tin ion moves to the cathode due to the potential difference between the anode and the cathode. Oxygen at the cathode obtains an electron and combines with water 10 and a potassium ion to form potassium hydroxide. Tin which has moved to the cathode obtains an electron and reacts to form a tin elementary substance.

A reaction equation of anode reaction during the reaction is: Sn−2e=Sn$^{2+}$,I$^-$−2e=I$_2$,2I$_2$+Sn=SnI$_4$↓; and a reaction equation of cathode reaction during the reaction is: 2H$^+$+2e=H$_2$↑,O$_2$+2 H$_2$O+4K$^+$+4e=4KOH,Sn$^{2+}$+2e=Sn↓.

In a reaction process, because reducibility of an iodine ion is stronger than that of tin, the iodine ion at the anode can be rapidly oxidized to generate an iodine elementary substance, and react with the tin of the weld leg 340 to generate a tin iodide insoluble substance. In this way, when tin at the anode is oxidized but dissolved in a small amount, a tin iodide protection layer may be formed on a surface of the weld leg 340 at the anode, thereby isolating the weld leg 340 from reacting with water. Because dissolved tin at the anode is in a small amount, a quantity of tin ions moving to the cathode is also very small, and a small quantity of tin elementary substances can be restored and generated at the cathode. Therefore, a quantity of dendrites generated at the cathode is also very small, and dendrite generation can be effectively suppressed.

In a reaction process, as shown in FIG. 6, the iodine ion at the cathode can move toward the anode due to the potential difference between the anode and the cathode, so that an iodine ion concentration at the anode is greater, and a tin iodide protection layer generated at the anode has better densification, so that the generated tin iodide protection layer can better isolate the weld leg 340 from water.

Figure 7:
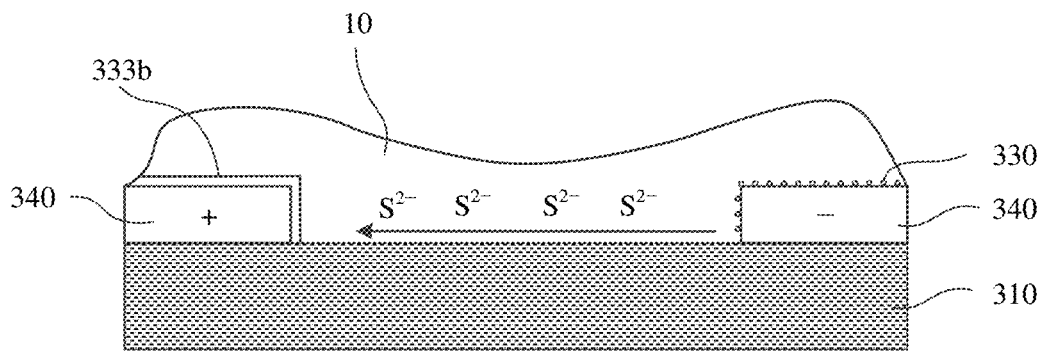
FIG. 7 is a schematic diagram in which a reaction particle of the circuit board in FIG. 4 is a sulfide, and reaction occurs when the circuit board is energized and in an environment with water.

FIG. 7 is a schematic diagram in which the reaction particle 330 of the circuit board 300 shown in FIG. 4 or FIG. 5 is a sodium sulfide particle, and reaction occurs when the circuit board 300 is energized and in an environment with water. A reaction process of the example shown in FIG. 7 is similar to that of the example shown in FIG. 6. For a specific process, refer to the foregoing detailed description of FIG. 6. When the circuit board 300 is in an environment with water 10, sodium sulfide is easily dissolved in water and decomposed into sulfur ions and sodium ions. A reaction equation of chemical reaction occurring in the example shown in FIG. 7 is as follows:

A reaction equation of anode reaction during the reaction is: $Sn-2e=Sn^{2+}, S^{2-}, -2e=S, 2S+Sn=SnS_2\downarrow$; and a reaction equation of cathode reaction during the reaction is: $2H^{+}+2e=H_2\uparrow, O_2+2H_2O+4Na^{+}+4e=4NaOH, Sn^{2+}+2e=Sn\downarrow$.

In a reaction process, because reducibility of a sulfur ion is stronger than that of tin, the sulfur ion at the anode can be rapidly oxidized to generate a sulfur elementary substance, and react with the tin of the weld leg 340 to generate a tin sulfide insoluble substance. A principle of suppressing dendrite generation when the reaction particle 330 is sulfide is similar to that of iodide, and details are not described herein again.

In an implementation, the circuit board 300 of the foregoing electronic device may include a board body 310, an electronic component 320, and an insoluble protection layer 333. The electronic component 320 is welded to a surface of the board body 310 by using soldering tin, and the insoluble protection layer 333 is attached to an outer surface of a weld leg 340 for welding the electronic component 320, to isolate the weld leg 340 from contacting water, thereby preventing dendrite corrosion of the weld leg 340. The insoluble protection layer 333 is a protection layer obtained when the reaction particle 330, which is disposed on the surface of the board body 310 and adjacent to the weld leg 340, reacts with the weld leg 340 when the circuit board 300 is energized and in an environment with water.

The insoluble protection layer 333 may be a tin iodide protection layer or a tin sulfide protection layer. A specific implementation method and a beneficial effect in this embodiment are similar to the implementation method and the beneficial effect of the circuit board 300 containing the reaction particle 330 in the foregoing embodiment, and details are not described herein again.

Figure 8:
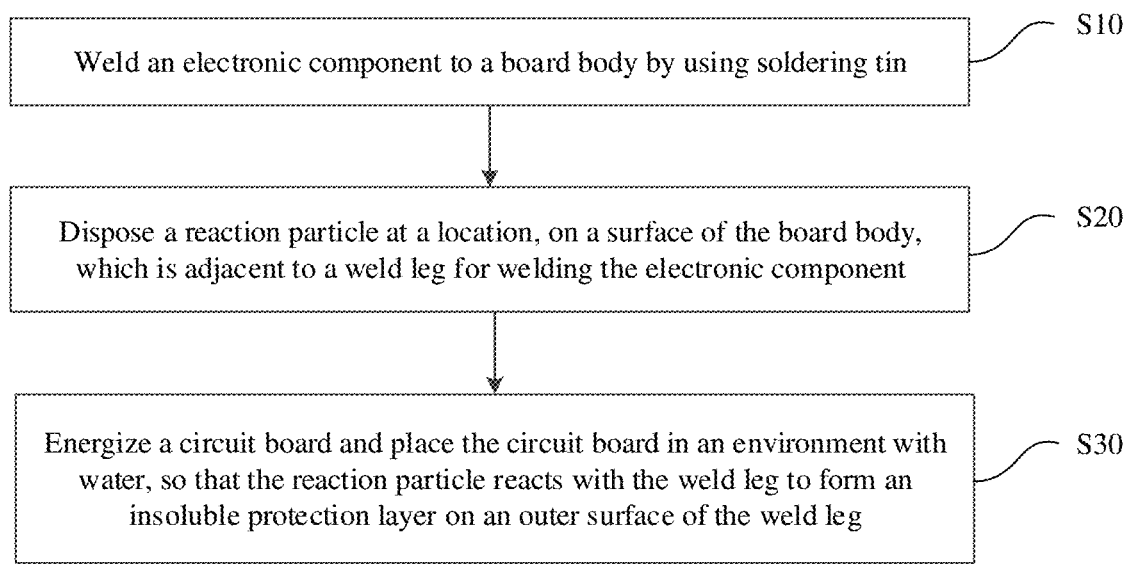
FIG. 8 is a flowchart of a production method for a circuit board according to an embodiment of this application.

FIG. 8 is a schematic flowchart of a production method for a circuit board 300 according to an embodiment of this application.

This application further provides a production method for a circuit board 300. As shown in FIG. 8, the method includes the following steps S10 and S20.

Step S10: Weld an electronic component 320 on a board body 310 by using soldering tin.

By using a welding process such as reflow soldering, wave soldering, and dip soldering, the electronic component 320 may be welded to the board body 310 by using soldering tin, or may be welded by using another welding process. This is not specifically limited in this application.

Specifically, a pin of the electronic component 320 may be electrically connected to a connector of the board body 310, and then the pin is fastened to the connector by welding, so that the pin of the electronic component 320 is securely electrically connected to the board body 310. Alternatively, a sheet-like component may be welded to the board body 310 by using an SMT.

Figure 10:
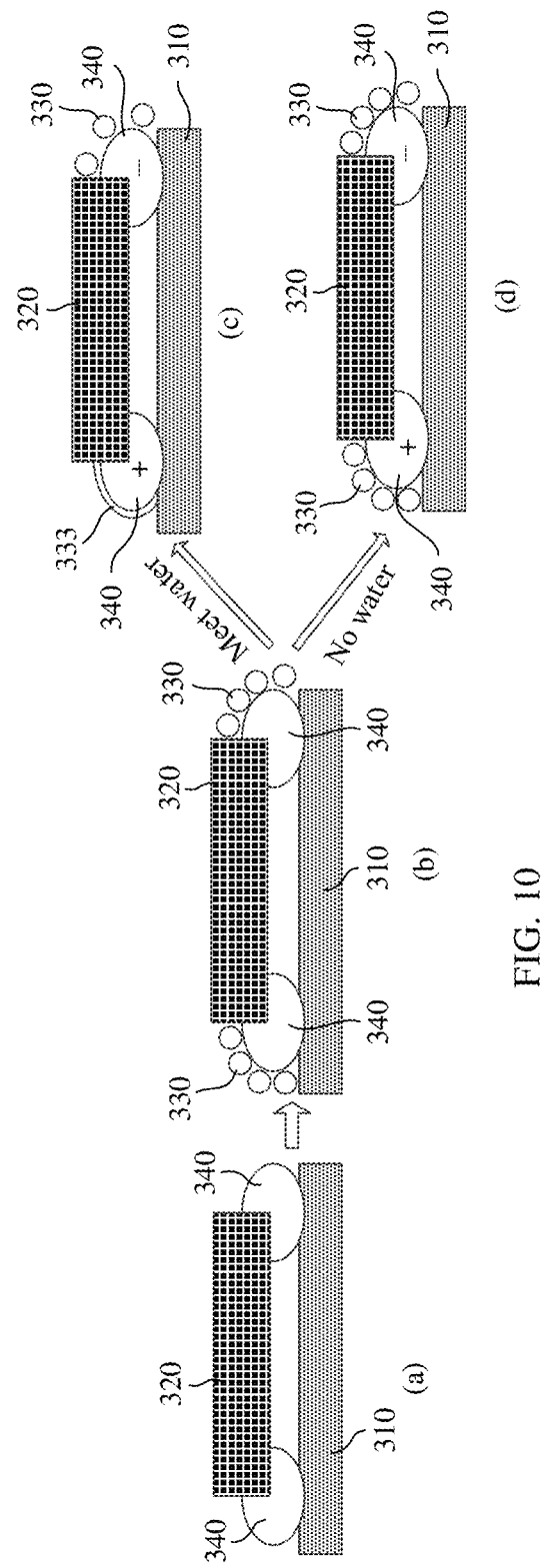
FIG. 10 is a schematic diagram of a process of a production method for a circuit board according to an embodiment of this application.

FIG. 10 is a schematic diagram of a process of a production method for a circuit board according to an embodiment of this application.

As shown in FIG. 10, after the electronic component 320 is welded to the board body 310 by using soldering tin, a structure shown in (a) in FIG. 10 is obtained, and the electronic component 320 and the board body 310 are fastened by using a weld leg 340.

Step S20: Dispose a reaction particle 330 at a location, on a surface of the board body 310, which is adjacent to the weld leg 340 for welding the electronic component 320.

By performing step S20, the circuit board 300 may be obtained.

A structure shown in (b) in FIG. 10 of the circuit board 300 is obtained by disposing the reaction particle 330 at the location, on the surface of the board body 310, which is adjacent to the weld leg 340 for welding the electronic component 320.

When the circuit board 300 is energized and in an environment with water, the reaction particle 330 reacts with the weld leg 340 to form an insoluble protection layer 333 on the outer surface of the weld leg 340, and the insoluble protection layer 333 isolates the weld leg 340 from contacting water to prevent dendrite corrosion of the weld leg 340. A structure in which the reaction particle 330 reacts with the weld leg 340 to form the insoluble protection layer 333 on the outer surface of the weld leg 340 is shown in (c) in FIG. 10.

In this embodiment, when there is no water on the circuit board 300, a structure of the circuit board 300 is shown in (d) in FIG. 10. The structure shown in (d) in FIG. 10 is the same as the structure shown in (b) in FIG. 10.

In step 520, the reaction particle may be disposed on the surface of the board body 310 by using any one of a coating method, a printing method, a soaking method, an atomization sedimentation method, a steam method, a vapor deposition method, a sputtering method, a spraying method, 3D printing, and the like.

Optionally, a solution containing the reaction particle may be prepared, the solution containing the reaction particle is adsorbed on the surface of the board body 310, and the reaction particle 330 is formed on the surface of the board body 310 after drying. Alternatively, powder or a particle of the reaction particle 330 may be directly attached to an outer surface of the board body 310 by using a 3D printing method, a spraying method, a sputtering method, or the like.

Optionally, a coating containing the reaction particle may be prepared, and the coating is painted or printed on the surface of the board body 310. Specifically, an epoxy group, an acrylic group, or a polyurethane base may be used as a major resin, and reaction particles such as potassium iodide, sodium iodide, and sodium sulfide which have a volume ratio of 1%-10% are mixed into the major resin, to obtain the coating containing the reaction particle. A volume ratio of the reaction particle in the coating may also be another ratio, which is not limited in this application.

During a process of welding the circuit board, to prevent a problem such as a bridging short circuit during welding, solder resist ink is generally coated on the outer surface of the board body to protect the board body. In this embodiment of this application, a reaction particle with a volume ratio of 1%-5% may be added to the solder resist ink. When the solder resist ink is coated on the board body, the reaction particle may also be coated on the surface of the board body.

The reaction particle 330 may be a compound, and anionic reducibility of the compound is higher than that of tin. In this way, when electrochemical corrosion occurs, an electron loss capability of anion of the reaction particle 330 is stronger than that of tin. The anion of the reaction particle 330 is oxidized before tin, so as to suppress oxidization and dissolving of the tin weld leg 340, thereby further reducing a probability that the tin weld leg 340 is oxidized and dissolved to a tin particle, and reducing a probability of dendrite corrosion of the weld leg 340.

Specifically, the compound may be a sulfide or an iodide, and the insoluble protection layer 333 formed on the weld leg 340 is a tin sulfide protection layer or a tin iodide protection layer.

In the production method for a circuit board 300 provided in this embodiment of this application, because the reaction particle 330 is disposed at the location, on the surface of the board body 310, which is adjacent to the weld leg 340 for welding the electronic component 320, when the circuit board 300 is energized and in an environment with water, the reaction particle 330 reacts with the weld leg 340 to form the insoluble protection layer 333 on the outer surface of the weld leg 340. In this way, the insoluble protection layer 333 can isolate the weld leg 340 from water, to prevent the weld leg 340 from contacting water. In this way, when there is water on the circuit board 300, dendrite corrosion of the weld leg 340 can be prevented.

Figure 9:
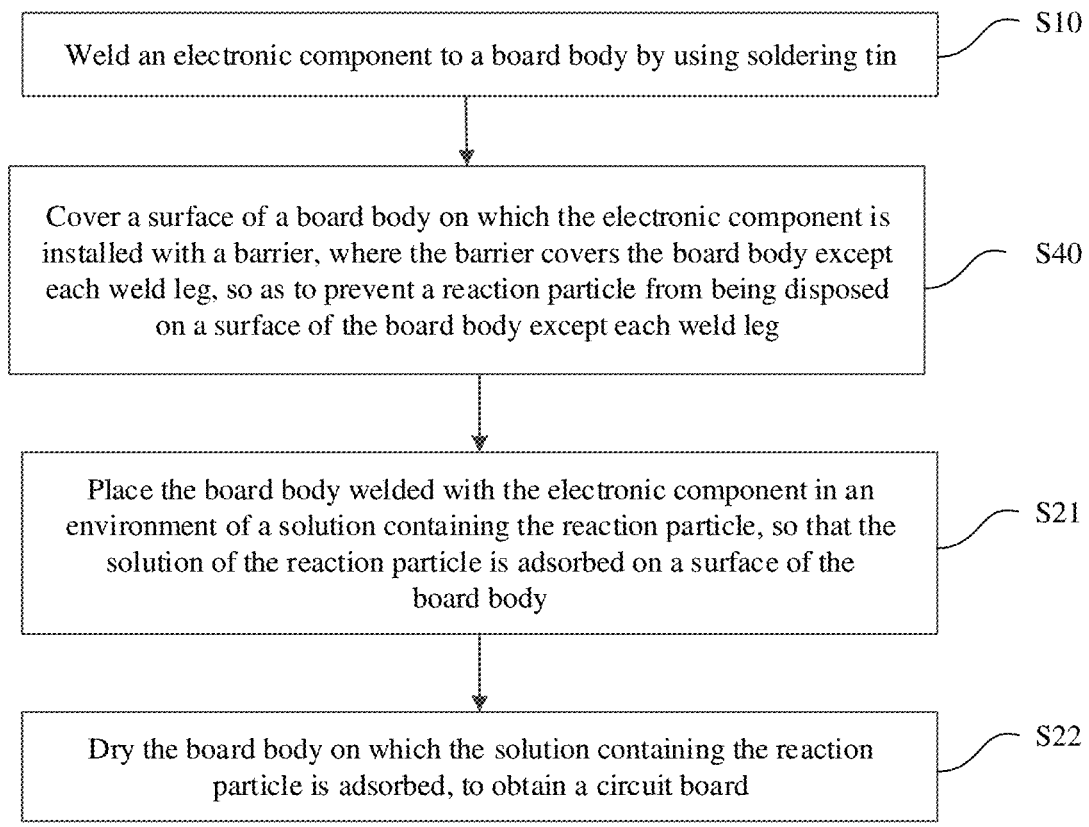
FIG. 9 is another flowchart of a production method for a circuit board according to an embodiment of this application.

FIG. 9 is another flowchart of a production method for a circuit board according to an embodiment of this application. In a specific embodiment, as shown in FIG. 9, step S20 may be implemented according to the following steps S21 and step S22.

Step S21: Place the board body 310 welded with the electronic component 320 in an environment of a solution containing the reaction particle, so that the solution of the reaction particle is adsorbed on the surface of the board body 310.

Step S22: Dry the board body 310 on which the solution containing the reaction particle is adsorbed, to obtain the circuit board 300.

In this embodiment, the reaction particle 330 may be a substance that is dissolvable in water. For a specific component of the reaction particle 330, refer to the foregoing embodiment description of the circuit board 300. Details are not described herein again.

The solution containing the reaction particle may be a saturated solution, or may be an unsaturated solution. For example, a volume ratio of the solution containing the reaction particle may be in a range from 1% to 10%, that is, the saturated solution containing the reaction particle 330 of 1 to 10 volumes is added to 100 volumes of solvent (water or alcohol), to form the solution. A volume ratio range of the solution containing the reaction particle may also be another ratio, such as 5%-10% or 5%-15%, which is not specifically limited in this application.

The solution containing the reaction particle may be an aqueous solution, or may be an alcoholic solution. The alcoholic solution is obtained by dissolving the reaction particle 330 in alcohol, and the aqueous solution is obtained by dissolving the reaction particle 330 in water.

An environment of the solution containing the reaction particle may be in an original state (that is, a liquid state) environment of a solution, or may be a steam environment or a vapor environment generated when a solution changes a physical form after processing such as evaporation or atomization.

In an optional implementation, step S21 may be implemented according to the following steps: After the solution containing the reaction particle is distilled, steam containing the reaction particle 330 is obtained, and the board body 310 welded with the electronic component 320 is placed in the obtained steam. In this example, a steam generator may be used to convert the solution containing the reaction particle into steam.

In an optional implementation, step S21 may alternatively be implemented according to the following step: Soak the board body 310 welded with the electronic component 320 in the solution containing the reaction particle.

Figure 13:
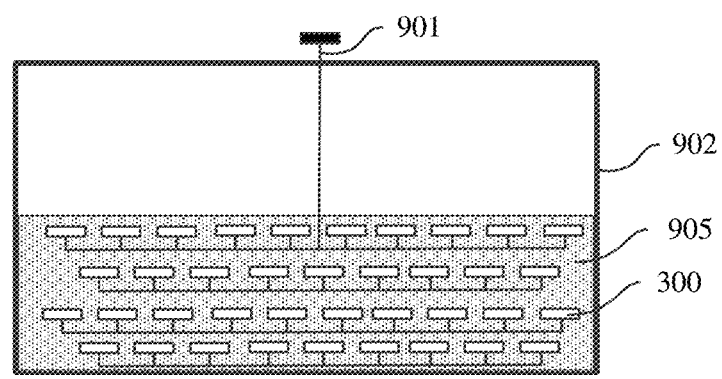
FIG. 13 is a schematic diagram of an operation of disposing a reaction particle on a board body in a production method for a circuit board according to an embodiment of this application.

FIG. 13 is a schematic diagram of an operation of disposing a reaction particle 330 on a board body 310 in a production method for a circuit board 300 according to an embodiment of this application.

As shown in FIG. 13, a solution 905 containing the reaction particle may be put into a box 902, and each board body 310 welded with the electronic component 320 may be placed on a placing rack of a lifting mechanism 901. Each board body 310 welded with the electronic component 320 may be placed in the solution 905 containing the reaction particle by using the lifting mechanism 901, and each board body 310 welded with the electronic component 320 may be lifted from the solution. In this way, the solution 905 containing the reaction particle may be attached to a surface of each board body 310 welded with the electronic component 320.

In this embodiment, the board body 310 is directly soaked in the solution 905 containing the reaction particle, and the solution may be adsorbed on the surface of the board body 310 simply and conveniently. Therefore, a process for disposing a reaction particle 330 on the surface of the board body 310 is simpler, so that a production process of the circuit board 300 and an electronic device is simpler, and production costs are lower.

In an optional embodiment, step S21 may alternatively be implemented according to the following step: Atomize the solution 905 containing the reaction particle, and place the board body 310 welded with the electronic component 320 in the atomized solution.

Figure 14:
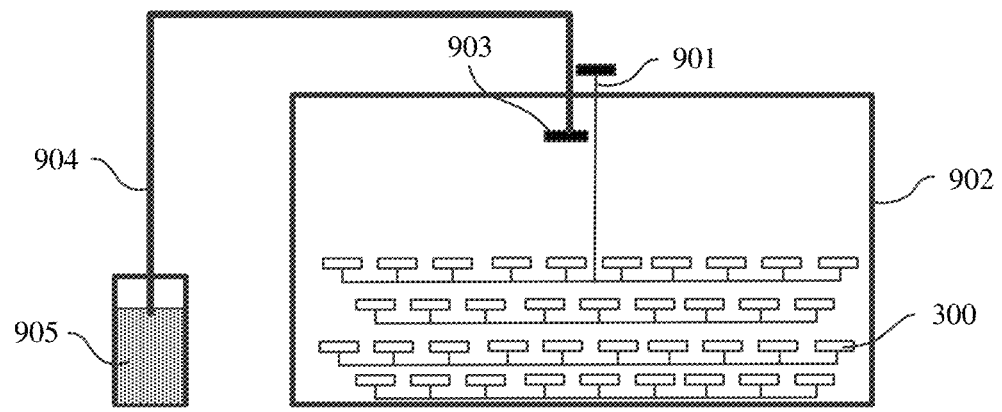
FIG. 14 is another schematic diagram of an operation of disposing a reaction particle on a board body in a production method for a circuit board according to an embodiment of this application.

FIG. 14 is another schematic diagram of an operation of disposing a reaction particle 330 on a board body 310 in a production method for a circuit board 300 according to an embodiment of this application.

As shown in FIG. 14, the solution 905 containing the reaction particle may be delivered into an atomizer 903 by using a pipeline 904, and atomized by using the atomizer 903. Mist sprayed from the atomizer 903 is sprayed into the box 902. Each board body 310 welded with the electronic component 320 is placed on the placing rack of the lifting mechanism 901, and each board body 310 welded with the electronic component 320 is placed in the mist in the box 902 by using the lifting mechanism 901. Then, each board body 310 welded with the electronic component 320 is lifted from the box 902. In this way, the solution 905 containing the reaction particle may be attached to the surface of each board body 310 welded with the electronic component 320.

In this embodiment, the board body 310 is placed in the atomized solution 905 of the reaction particle, so that a process for disposing the reaction particle 330 on the surface of the board body 310 is simple and convenient. Therefore, a production process of the circuit board 300 and an electronic device is simpler, and production costs are lower.

In addition, because a density of the atomized solution is relatively low, the board body 310 is placed in the atomized solution, which can make the board body 310 not too wet after the solution 905 of the reaction particle is adsorbed on the board body 310, so that the board body 310 can be quickly dried. Therefore, production efficiency of the circuit board 300 is improved, and a probability that the solution 905 of the reaction particle soaks inside each electronic component 320 to make the electronic component 320 damaged is reduced, so that reliability of the circuit board 300 and the electronic device is higher, and a fault rate is lower.

In the foregoing step S22, the board body 310 on which the solution 905 containing the reaction particle is adsorbed may be placed in a drying stove for drying. A drying temperature may be lower than 35° C., that is, drying is performed at a low temperature, to reduce impact of a high temperature on each component of the circuit board 300.

In this embodiment, the solution 905 containing the reaction particle is adsorbed on the board body 310 and then dried to obtain the circuit board 300, so that the reaction particle 330 can be conveniently disposed on the surface of the board body 310. In the solution 905 of the reaction particle, the reaction particle 330 is evenly distributed. Therefore, in this embodiment, the reaction particle 330 disposed on the surface of the board body 310 can further be more evenly distributed, so that when the circuit board 300 is energized and meets water, an insoluble protection layer 333 with good uniformity can be formed on each part of the surface of the weld leg 340, and each part of the outer surface of the weld leg 340 cannot contact water, thereby reducing a probability of dendrite corrosion of the weld leg 340.

In an implementation, step S20 may be implemented according to the following step: Sputter, by using a sputtering method, and adsorb the reaction particle 330 at a location, on the surface of the board body 310, which is adjacent to the weld leg 340 for welding the electronic component 320.

Figure 15:
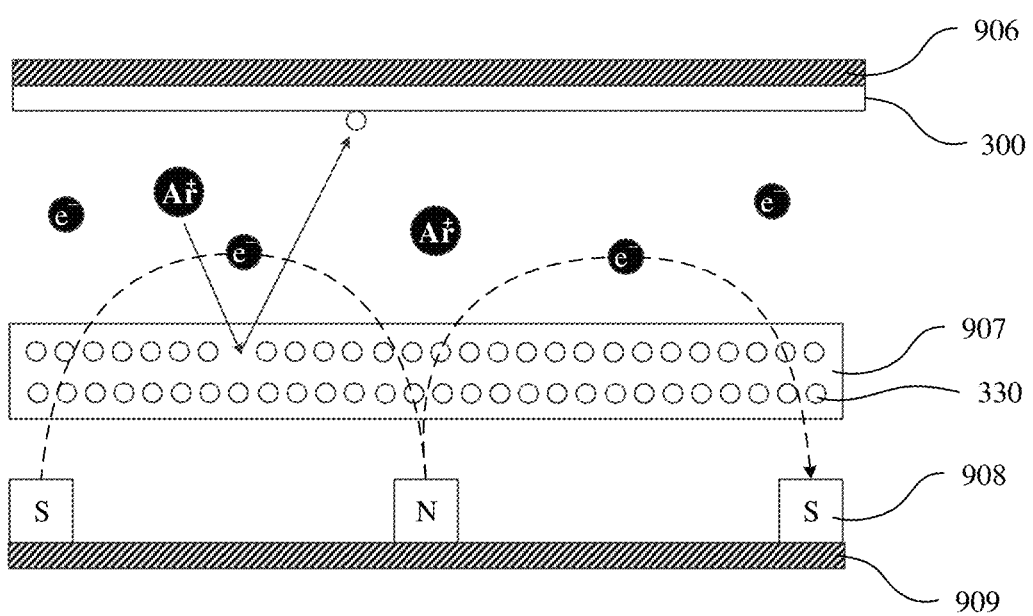
FIG. 15 is still another schematic diagram of an operation of disposing a reaction particle on a board body in a production method for a circuit board according to an embodiment of this application.

FIG. 15 is another schematic diagram of an operation of disposing a reaction particle 330 on a circuit board 300 in a production method for a circuit board 300 according to an embodiment of this application.

As shown in FIG. 15, a process of disposing the reaction particle 330 on the surface of the board body 310 by using the sputtering method may be specifically: filling a vacuum coating chamber (not shown in the figure) with a proper amount of argon gas, placing a target material 907 of the reaction particle at a location close to cathode, applying a voltage between a cathode board 909 and an anode board 906 (a coating chamber wall), and rapidly increasing energy of an electron emitted from a surface of the cathode board 909 by means of acceleration of an electric field. A high-energy electron can collide with the argon gas to decompose a positive argon ion. Under an effect of the electric field, the argon ion moves to the cathode board 909 and the target material 907 of the reaction particle to bombard a surface of the target material 907 of the reaction particle, and the reaction particle 330 in the target material 907 of the reaction particle obtains energy from bombardment, and is finally discharged from the target material 907 of the reaction particle to sputter on the board body 310.

Optionally, as shown in FIG. 15, the sputtering method may be a magnetron sputtering method. The magnetron sputtering method is that a plurality of magnets 908 with different polarities are disposed in the vacuum coating chamber. The magnets 908 with different polarities form a magnetic field, and electrons can move helically along a magnetic line of the magnetic field. Therefore, a movement path of electrons is increased, a probability of colliding between the electron and argon gas is improved, and a quantity of the reaction particle 330 sputtered from the target material 907 of the reaction particle is increased, so that sputtering efficiency is higher and an sputtering effect can be more uniform.

In this embodiment, the reaction particle 330 may be directly sputtered and adsorbed on the surface of the board body 310 by using the sputtering method, and no drying or another subsequent processing process is required, so that a production process of the circuit board 300 has fewer steps and a simpler process. In addition, by using the sputtering method, the board body 310 is always in a dry environment, so that a process of disposing the reaction particle 330 does not affect another part of the circuit board 300, and reliability of the circuit board 300 is higher. In addition, by using the sputtering method, a film of the reaction particle 330 with a more uniform thickness and better densification can be formed on the surface of the board body 310, so that when the circuit board 300 is energized and meets water, an insoluble protection layer 333 with better uniformity can be formed on the weld leg 340.

In an implementation, step S20 may be implemented according to the following step: Dispose the reaction particle 330 on the outer surface of the weld leg 340 welded with the electronic component 320.

In this implementation, the reaction particle 330 may be disposed on the outer surface of the weld leg 340, and the reaction particle is not disposed on the surface of the board body 310 except the outer surface of the weld leg 340. In this way, in a case in which the circuit board 300 meets water and is energized, the reaction particle 330 may react rapidly with the weld leg 340 to form the insoluble protection layer 333, and a probability of the weld leg 340 being oxidized and dissolved is reduced, thereby reducing a probability of dendrite corrosion of the weld leg 340. In addition, there is no need to dispose the reaction particle 330 on the surface of the board body 310 except the weld leg 340, so that impact of the reaction particle 330 on the board body 310 can be reduced, and the circuit board 300 can be more reliable.

Specifically, as shown in FIG. 9, before step S21, that is, before step S20, the production method for the circuit board 300 may further include the following step S40.

Step 40: Cover the surface of the board body 310 on which the electronic component 320 is installed with a barrier, where the barrier covers the board body 310 except each weld leg 340, so as to prevent the reaction particle 330 from being disposed on the surface of the board body 310 except each weld leg 340.

The barrier may be a dam board, a housing, a barrier film, and the like. A plurality of through-holes are disposed in the barrier, a size of each through-hole is corresponding to a size of each weld leg 340, and the through-hole is used to make the weld leg 340 exposed, so as to facilitate disposing of the reaction particle 330.

In this embodiment, by using the barrier, the board body 310 except the weld leg 340 may be covered, so as to prevent the reaction particle 330 from being disposed on a part except the weld leg 340, thereby reducing impact of the reaction particle 330 on the circuit board 300 except the weld leg 340, and improving structural stability and reliability of the circuit board 300.

In an implementation, as shown in FIG. 8, the production method for the circuit board 300 may further include the following step S30.

Step S30: Energize the circuit board 300, and place the circuit board 300 in an environment with water, so that the reaction particle 330 reacts with the weld leg 340 to form an insoluble protection layer 333 on the outer surface of the weld leg 340.

Specifically, in this implementation, when the circuit board 300 is energized, the circuit board 300 is soaked in water, or water is sprayed on the circuit board 300, or the circuit board 300 is placed in vapor or water after atomization, so that the reaction particle 330 reacts with the weld leg 340 to form the insoluble protection layer 333 on the outer surface of the weld leg 340.

In this implementation, the circuit board 300 may be energized first, and then placed in an environment with water, or the circuit board 300 may be placed in an environment with water first, and then energized, or the circuit board 300 may be energized, and at the same time, placed in an environment with water. This is not specifically limited in this application.

For a process in which the reaction particle 330 reacts with the weld leg 340 to form the insoluble protection layer 333 on the outer surface of the weld leg 340, refer to the foregoing specific description of the embodiment of the circuit board 300. Details are not described herein again.

In this embodiment, when the board body 310 is energized, the board body 310 is placed in an environment of the solution 905 containing the reaction particle. In this way, when the reaction particle 330 is attached to the surface of the board body 310, the insoluble protection layer 333 is formed on the outer surface of the weld leg 340. In this way, a process of forming the insoluble protection layer 333 is simultaneously performed with a process of disposing the reaction particle 330, which reduces a production process step of the circuit board 300, and makes a production process of the circuit board 300 simpler.

In an implementation, step S20 and step S30 may be implemented according to the following steps:

energizing the board body 310 on which the electronic component 320 is installed, and placing the board body 310 in an environment of the solution 905 containing the reaction particle, so that the reaction particle 330 reacts with the weld leg 340 to form the insoluble protection layer 333 on the outer surface of the weld leg 340, to obtain the circuit board 300.

Figure 11:
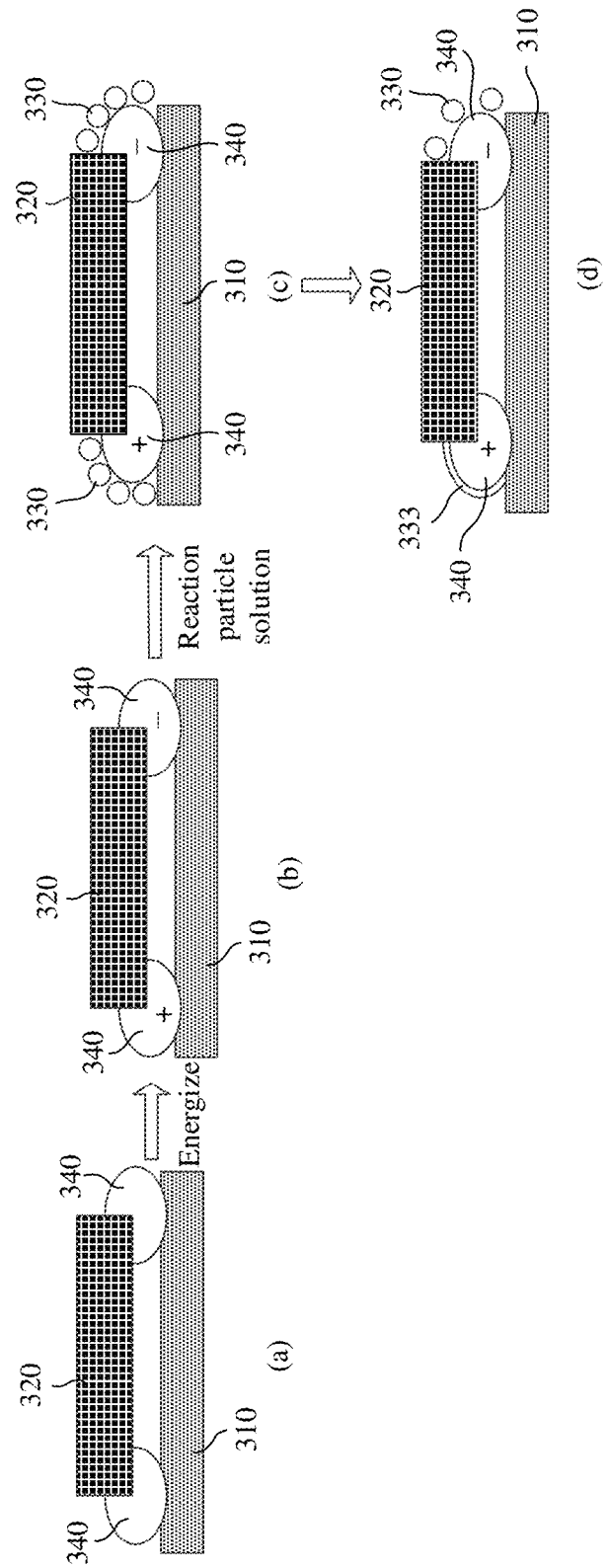
FIG. 11 is another schematic diagram of a process of a production method for a circuit board according to an embodiment of this application.

FIG. 11 is another schematic diagram of a process of a production method for a circuit board 300 according to an embodiment of this application. As shown in FIG. 11, the board body 310 on which the electronic component 320 is installed may be energized first, so that the board body 310 on which the electronic component 320 is installed changes from a state (a) in FIG. 11 to a state (b) in FIG. 11. Then the energized board body 310 is placed in the solution 905 containing the reaction particle, so that the solution 905 containing the reaction particle is attached to the weld leg 340. The board body 310 on which the solution containing the reaction particle is attached is shown in (c) in FIG. 11, and a structure is shown in (d) in FIG. 11 after the reaction particle 330 on the surface of the weld leg 340 at the anode reacts with the weld leg 340 to form the insoluble protection layer 333.

Figure 12:
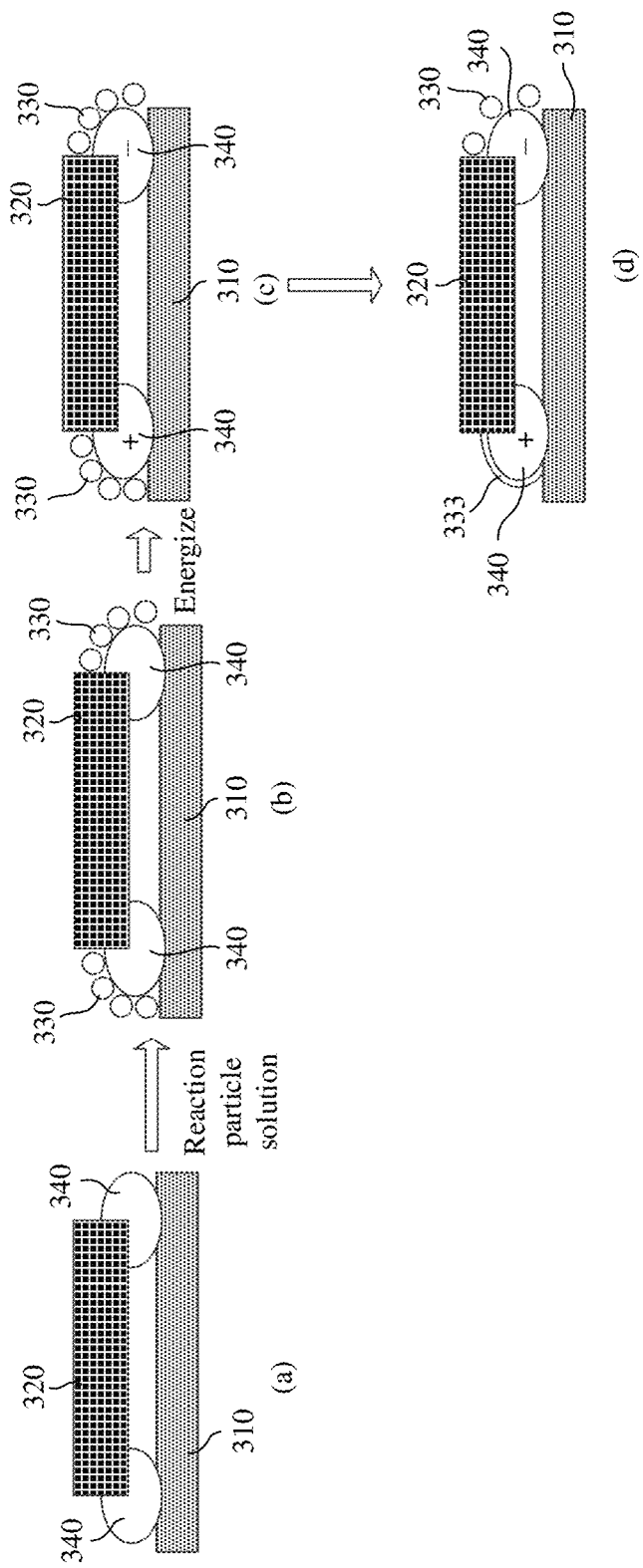
FIG. 12 is still another schematic diagram of a process of a production method for a circuit board according to an embodiment of this application.

FIG. 12 is still another schematic diagram of a process of a production method for a circuit board 300 according to an embodiment of this application. As shown in FIG. 12, the board body 310 on which the electronic component 320 is installed may be first placed in the solution 905 containing the reaction particle, so that the board body 310 on which the electronic component 320 is installed changes from a state (a) in FIG. 12 to a state (b) in FIG. 12 in which the solution 905 containing the reaction particle is attached to the weld leg 340. Then the circuit board 300 is energized, so that the circuit board 300 becomes a state (c) in FIG. 12. A structure is shown in (d) in FIG. 12 after the reaction particle 330 on the surface of the weld leg 340 at the anode reacts with the weld leg 340 to form the insoluble protection layer 333.

In this implementation, step S20 and step S30 are combined into one step for implementation, that is, the step of disposing the reaction particle 330 on the board body 310 is simultaneously performed with the step of forming the insoluble protection layer 333 on the outer surface of the weld leg 340.

In this implementation, the board body 310 is placed in an environment of the solution 905 containing the reaction particle, which can make not only the solution 905 of the reaction particle be attached to the surface of the weld leg 340, but also the circuit board 300 be in an environment with water, so that the insoluble protection layer 333 can be formed on the outer surface of the weld leg 340.

In this implementation, a process of forming the insoluble protection layer 333 is simultaneously performed with a process of disposing the reaction particle 330, which reduces a production process step of the circuit board 300, and makes a production process of the circuit board 300 simpler.

In an implementation, after the insoluble protection layer 333 is formed, the production method for the circuit board 300 may further include the following step: cleaning and drying the circuit board 300 formed with the insoluble protection layer 333.

Specifically, the circuit board 300 may be cleaned by using an ultrasonic cleaning machine, or may be cleaned by using a washing machine. A cleaning solution may be water, or may be an alcoholic solution.

In this embodiment, the reaction particle 330 remaining on the circuit board 300, the reaction particle 330 and the weld leg 340, and an intermediate product generated in a process of water reaction may be washed off, so that impact of these substances on performance of the circuit board 300 can be reduced.

The foregoing descriptions are merely specific implementations of this application, but are not intended to limit the protection scope of this application. Any change or replacement readily figured out by a person skilled in the art within the technical scope disclosed in this application shall fall within the protection scope of this application. Therefore, the protection scope of this application shall be subject to the protection scope of the claims.

What is claimed is:

1. A circuit board, comprising:
   a board body;
   an electronic component, welded to a surface of the board body by using soldering tin; and
   a reaction particle, disposed on the surface of the board body and adjacent to a weld leg for welding the electronic component, wherein when the circuit board is energized and in an environment with water, the reaction particle reacts with the weld leg to form an insoluble protection layer on an outer surface of the weld leg, and the insoluble protection layer isolates the weld leg from water.

2. The circuit board according to claim 1, wherein the reaction particle is a compound, and anionic reducibility of the compound is higher than that of tin.

3. The circuit board according to claim 2, wherein the compound is a sulfide or an iodide.

4. The circuit board according to claim 1, wherein the insoluble protection layer is a tin sulfide protection layer or a tin iodide protection layer.

5. The circuit board according to claim 1, wherein the reaction particle is disposed on the outer surface of the weld leg.

6. The circuit board according to claim 1, wherein the reaction particle is dissolvable in water.

7. The circuit board according to claim 1, wherein the reaction particle is attached to the surface of the board body in a form of powder or a particle.

8. An electronic device, comprising a housing and the circuit board installed inside the housing according to claim 1.

9. A production method for a circuit board, wherein the method comprises:
   welding an electronic component to a board body by using soldering tin; and
   disposing a reaction particle at a location, on a surface of the board body, which is adjacent to a weld leg for welding the electronic component, to obtain the circuit board, wherein when the circuit board is energized and in an environment with water, the reaction particle reacts with the weld leg to form an insoluble protection layer on an outer surface of the weld leg, and the insoluble protection layer isolates the weld leg from water.

10. The production method according to claim 9, wherein the disposing a reaction particle at a location, on a surface of the board body, which is adjacent to a weld leg for welding the electronic component, to obtain the circuit board comprises:
    placing the board body welded with the electronic component in an environment of a solution comprising the reaction particle, so that the solution comprising the reaction particle is adsorbed on the surface of the board body; and
    drying the board body on which the solution is adsorbed to obtain the circuit board.

11. The production method according to claim 10, wherein the placing the board body welded with the electronic component in an environment of a solution comprising the reaction particle comprises:
    soaking the board body welded with the electronic component in the solution of the reaction particle.

12. The production method according to claim 10, wherein the placing the board body welded with the electronic component in an environment of a solution comprising the reaction particle comprises:
    atomizing the solution of the reaction particle; and
    placing the board body welded with the electronic component in an atomized solution.

13. The production method according to claim 9, wherein the disposing a reaction particle at a location, on a surface of the board body, which is adjacent to a weld leg for welding the electronic component comprises:
    disposing the reaction particle on an outer surface of the weld leg for welding the electronic component.

14. The production method according to claim 13, wherein before the disposing a reaction particle at a location, on a surface of the board body, which is adjacent to a weld leg for welding the electronic component, the method further comprises:
    covering the surface of the board body on which the electronic component is installed with a barrier, wherein the barrier covers the board body except each weld leg, so as to prevent the reaction particle from being disposed on the surface of the board body except each weld leg.

15. The production method according to claim 9, wherein the disposing a reaction particle at a location, on a surface of the board body, which is adjacent to a weld leg for welding the electronic component comprises:
    sputtering, by using a sputtering method, and adsorbing the reaction particle at the location, on the surface of the board body, which is adjacent to the weld leg for welding the electronic component.

16. The production method according to claim 9, wherein the method further comprises:
    energizing the circuit board and placing the circuit board in an environment with water, so that the reaction particle reacts with the weld leg to form the insoluble protection layer on the outer surface of the weld leg.

17. The production method according to claim 16, wherein the disposing a reaction particle at a location, on a surface of the board body, which is adjacent to a weld leg for welding the electronic component, and energizing the circuit board and placing the circuit board in an environment with water comprises:
    energizing the board body on which the electronic component is installed, and placing the board body in an environment of a solution comprising the reaction particle.

18. The production method according to claim 16, wherein the method further comprises:
    cleaning and drying the circuit board formed with the insoluble protection layer.

19. The production method according to claim 9, wherein the reaction particle is a compound, and anionic reducibility of the compound is higher than that of tin.

20. The production method according to claim 19, wherein the compound is a sulfide or an iodide.

* * * * *